US012653019B2

(12) United States Patent
Lee et al.

(10) Patent No.: US 12,653,019 B2
(45) Date of Patent: Jun. 9, 2026

(54) INTERCONNECT STRUCTURE HAVING HEAT DISSIPATION CAPABILITY AND METHOD FOR MANUFACTURING THE SAME

(71) Applicant: TAIWAN SEMICONDUCTOR MANUFACTURING COMPANY, LTD., Hsinchu (TW)

(72) Inventors: Cheng-Chin Lee, Hsinchu (TW); Hsin-Yen Huang, Hsinchu (TW); Hsiao-Kang Chang, Hsinchu (TW); Yen-Ju Wu, Hsinchu (TW); Shao-Kuan Lee, Hsinchu (TW); Li-Ling Su, Hsinchu (TW); Chia-Chen Lee, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 396 days.

(21) Appl. No.: 18/333,380

(22) Filed: Jun. 12, 2023

(65) Prior Publication Data

US 2024/0413075 A1     Dec. 12, 2024

(51) Int. Cl.
*H10W 20/42*      (2026.01)
*H10W 20/00*      (2026.01)

(52) U.S. Cl.
CPC ......... *H10W 20/42* (2026.01); *H10W 20/056* (2026.01); *H10W 20/075* (2026.01); *H10W 20/097* (2026.01)

(58) Field of Classification Search
CPC . H10W 20/01; H10W 20/021; H10W 20/023; H10W 20/031; H10W 20/032; H10W 20/033; H10W 20/035; H10W 20/056; H10W 20/075; H10W 20/076; H10W 20/0765; H10W 20/081; H10W 20/082; H10W 20/084; H10W 20/088; H10W 20/097; H10W 20/098; H10W 20/20; H10W 20/211; H10W 20/42
See application file for complete search history.

(56) References Cited

U.S. PATENT DOCUMENTS

2011/0049727 A1*  3/2011  Aubel ............... H01L 23/53295
                                                     257/773

* cited by examiner

*Primary Examiner* — Thanhha S Pham
(74) *Attorney, Agent, or Firm* — Birch, Stewart, Kolasch & Birch, LLP

(57)          ABSTRACT

A semiconductor structure includes a base structure including a substrate and a device unit disposed on a front surface of the substrate, a front dielectric portion disposed on the front surface to cover the device unit, a front conductive layer disposed in the front dielectric portion and connected to the device unit, a back dielectric unit disposed on a back surface of the substrate opposite to the front surface and including at least one first part which includes a first dielectric portion having a thermal conductivity which is greater than that of the front dielectric portion, and a back conductive unit which is disposed in the back dielectric unit and connected to the device unit, and which includes at least one first conductive layer disposed in the at least one first part.

20 Claims, 21 Drawing Sheets

6

Forming a patterned structure including a base structure — S61

Forming a dielectric portion on the base substrate to expose a portion of the base structure through a recess — S62

Forming a liner portion and a conductive layer to fill the recess — S63

INTERCONNECT STRUCTURE HAVING HEAT DISSIPATION CAPABILITY AND METHOD FOR MANUFACTURING THE SAME

BACKGROUND

With rapid development of semiconductor technology, the integration density of various electronic components, such as transistors, diodes, resistors, capacitors, etc., is being continuously improved by continual reduction in minimum feature sizes. As the feature sizes decrease, the distance between metal features is continually reduced, which increases the resulting parasitic capacitance between the metal features, thereby leading to higher power consumption and larger resistance-capacitance (RC) time delays for an integrated circuit. In addition to RC time delay performance, heat dissipation of the integrated circuit is getting more critical due to higher integration density of the integrated circuit. A structure having an excellent heat dissipation capability and an acceptable RC time delay performance is under continuous development.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
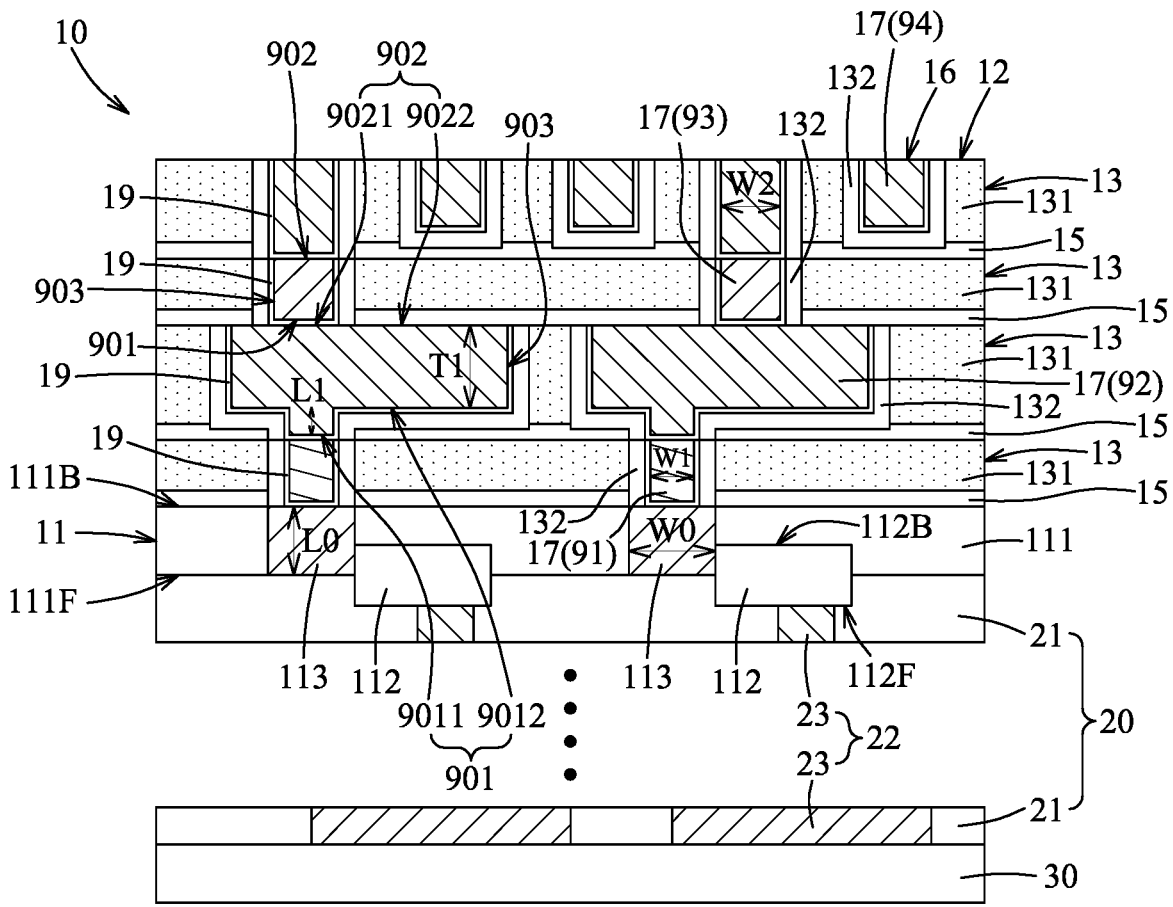
FIG. 1 is a schematic sectional view illustrating a semiconductor structure in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "above," "top," "bottom," "upper," "lower," "over," "beneath," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

For the purposes of this specification and appended claims, unless otherwise indicated, all numbers expressing amounts, sizes, dimensions, proportions, shapes, formulations, parameters, percentages, quantities, characteristics, and other numerical values used in the specification and claims, are to be understood as being modified in all instances by the term "about" even though the term "about" may not expressly appear with the value, amount or range. Accordingly, unless indicated to the contrary, the numerical parameters set forth in the following specification and attached claims are not and need not be exact, but may be approximate and/or larger or smaller as desired, reflecting tolerances, conversion factors, rounding off, measurement error and the like, and other factors known to those of skill in the art depending on the desired properties sought to be obtained by the presently disclosed subject matter. For example, the term "about," when referring to a value can be meant to encompass variations of, in some aspects ±10%, in some aspects ±5%, in some aspects ±2.5%, in some aspects ±1%, in some aspects ±0.5%, and in some aspects ±0.1% from the specified amount, as such variations are appropriate to perform the disclosed methods or employ the disclosed compositions.

In order to reduce resistance-capacitance (RC) time delays of an integrated circuit, low dielectric constant (k) materials and/or air gaps (which has a lowest k value, i.e., about 1) are widely used as an inter-metal dielectric. Air gaps and a low-k inter-metal dielectric which has a relatively high porosity usually have a relatively low thermal conductivity, and hence, heat generated during operation of an integrated circuit is mainly dissipated through a bulk silicon substrate. With rapid development of semiconductor technology, the bulk silicon substrate, which has a front-side where electronic components are disposed, may be thinned down from a backside opposite to the front-side so as to have a back surface. Afterwards, a backside metallization scheme, which may be referred to as a super power rail (SPR), may be further formed on the back surface to alleviate routing congestion in a front-side metallization scheme which is disposed at the front-side. As such, the thinned-down silicon substrate may have a lower heat dissipation capability due to the reduced volume thereof. Therefore, the present disclosure is directed to an inter-metal dielectric scheme, which is disposed around the backside metallization scheme and which has an improved heat dissipation capability, so as to solve poor heat dissipation of the thinned down silicon substrate. Furthermore, the electric leakage between two adjacent metal features in the backside metallization scheme is kept low due to a high breakdown strength of the inter-metal dielectric scheme.

FIG. 1 is a schematic sectional view illustrating a semiconductor structure 10 in accordance with some embodiments. Some repeating structures are omitted in FIG. 1 and the following figures for the sake of brevity.

The semiconductor structure 10 includes a base structure 11 including a substrate 111, a first dielectric unit 12 disposed on the substrate 111, and a first conductive unit 16 disposed in the first dielectric unit 12.

In some embodiments, the substrate 111 may be made of elemental semiconductor materials, such as crystalline silicon, diamond, or germanium; compound semiconductor materials, such as silicon carbide, gallium arsenic, indium arsenide, or indium phosphide; or alloy semiconductor materials, such as silicon germanium, silicon germanium carbide, gallium arsenic phosphide, or gallium indium phosphide. In addition, the substrate 111 may be a bulk silicon substrate, a silicon-on-insulator (SOI) substrate, or a germanium-on-insulator (GOI) substrate. Other suitable materials for the substrate 111 are within the contemplated scope of the present disclosure. The substrate 111 has a front surface 111F and a back surface 111B opposite to the front surface 111F.

In some embodiments, the base structure 11 further includes at least one device unit 112 (two of which are shown in FIG. 1) disposed on the front surface 111F of the substrate 111. In some embodiments, each of the device units 112 may include active devices (for example, transistors, metal-oxide-semiconductor field-effect transistors (MOSFET), complementary metal-oxide-semiconductor (CMOS), etc.), passive devices (for example, capacitors, resistors, or the like), logic circuits, memory cells, inverters, decoders, amplifiers, or combinations thereof. In some embodiments, each of the transistors may be configured as fin-type FETs (FinFET), multi-gate FETs (e.g., gate-all-around FETs (GAAFET), multi-bridge channel FETs (MBCFET), fork-sheet FETs, other three-dimensional transistors, or other suitable transistor structures.

The first dielectric unit 12 includes at least one first part 13 which includes a first dielectric portion 131. The first dielectric portion 131 is made of a high thermal conductivity material, and has a thermal conductivity which is greater than about 10 W/mK. In some embodiments, the first dielectric portion 131 may have a thermal conductivity which is greater than about 100 W/mK. In some embodiments, high thermal conductivity materials suitable for the first dielectric portion 131 include diamond, graphite, aluminum nitride, aluminum oxide, boron arsenide, boron carbide, beryllium oxide, silicon oxide, silicon nitride, silicon carbide, magnesium oxide, zirconium oxide, bismuth oxide, titanium oxide, gallium oxide, gallium nitride, gallium arsenide, hafnium oxide, indium antimony, other suitable metal oxides, two-dimensional materials (such as graphene, hexagonal-boron nitride, or beta-carbon nitride), or combinations thereof. It is noted that the dielectric materials as mentioned above (e.g., oxide-based materials, nitride-based materials and carbide-based materials) are formed to have a high crystallinity so as to exhibit a high thermal conductivity characteristics. Furthermore, the two-dimensional materials as mentioned above have anisotropy in thermal conductivity. Each of the two-dimensional materials has a basal plane in which atoms are covalently bonded, and may have a thermal conductivity in the basal plane which is greater than a thermal conductivity in a direction normal to the basal plane. For example, hexagonal-boron nitride (h-BN) for the first dielectric portion 131 has a basal plane in which boron and nitrogen atoms are covalently bonded, and has a thermal conductivity in the basal plane of h-BN which is greater than a thermal conductivity in a direction normal to the basal plane of h-BN. In another example, graphene for the first dielectric portion 131 has a basal plane in which carbon atoms are covalently bonded, and has a thermal conductivity in the basal plane of graphene which is greater than a thermal conductivity in a direction normal to the basal plane of graphene. Therefore, in some embodiments, the basal plane of each of the two-dimensional materials for forming the first dielectric portion 131 may be formed to be parallel to the front surface 111F or the back surface 111B of the substrate 111, so that heat generated during operation of an integrated circuit can be dissipated laterally. Other dielectric materials with a high thermal conductivity suitable for the first dielectric portion 131 are within the contemplated scope of the present disclosure. In some embodiments, the first dielectric unit 12 is disposed on the back surface 111B of the substrate 111, as shown in FIG. 1. In some embodiments, the first dielectric unit 12 and the first conductive unit 16 shown in FIG. 1 may be referred to as a back dielectric unit and a back conductive unit, respectively.

The back conductive unit 16 is electrically conductive, and includes at least one first conductive layer 17 disposed in the at least one first part 13 and connected to the device units 112. In some embodiments, the at least one first conductive layer 17 may be made of copper (Cu), nickel (Ni), cobalt (Co), ruthenium (Ru), iridium (Ir), aluminum (Al), platinum (Pt), palladium (Pd), golden (Au), silver (Ag), osmium (Os), tungsten (W), molybdenum (Mo), titanium (Ti), rhodium (Rh), scandium (Sc), alloys thereof, or combinations thereof. Other suitable materials for forming the at least one first conductive layer 17 are within the contemplated scope of the present disclosure.

In some embodiments, the at least one first part 13 further includes a first liner portion 132 which is made of a high breakdown strength material, and which is disposed to entirely separate the at least one first conductive layer 17 from the first dielectric portion 131 in the at least one first part 13. The first liner portion 132 has a breakdown field ($E_{br}$) which is greater than that of the first dielectric portion 131. In some embodiments, possible high breakdown strength materials for the first liner portion 132 may include silicon oxide, silicon nitride, silicon carbide, silicon carbon nitride, aluminum oxide, aluminum nitride, aluminum oxynitride, zirconium oxide, hafnium oxide, zirconium aluminum oxide, hafnium aluminum oxide, hafnium silicon oxide, beryllium oxide, boron arsenide, boron carbide, magnesium oxide, bismuth oxide, titanium oxide, gallium oxide, gallium nitride, diamond, graphite, other suitable metal oxides, two-dimensional materials (such as graphene, hexagonal-boron nitride, or beta-carbon nitride), or combinations thereof. It is noted that the dielectric materials as mentioned above (e.g., oxide-based materials, nitride-based materials and carbide-based materials) are in an amorphous phase so as to exhibit high breakdown strength characteristics. For example, amorphous aluminum nitride for forming the first liner portion 132 may have a breakdown field ($E_{br}$) which is greater than that of crystalline aluminum nitride for forming the first dielectric portion 131. Furthermore, each of the two-dimensional materials may have a breakdown field in the basal plane thereof which is less than a breakdown field in the direction normal to the basal plane thereof. Therefore, the basal plane of each of the two-dimensional materials for forming the first dielectric portion 131 may be formed to be parallel to an interface between the at least one first conductive layer 17 and the first dielectric portion 131 so as to achieve a better electrical isolation. Other dielectric materials with a high breakdown field ($E_{br}$) suitable for the first liner portion 132 are within the contemplated scope of the present disclosure.

In some embodiments, the back dielectric unit 12 includes four of the first parts 13 stacked on each other, and the back conductive unit 16 includes four of the first conductive layers 17 which are respectively formed in the first parts 13, as shown in FIG. 1.

The first conductive layers 17 are also referred to as, in a direction away from the base structure 11, a first via feature 91, a first line feature 93, a second via feature 92, and a second line feature 94, respectively. The first line feature 92 is connected to the first and second via features 91, 93, and the second via feature 93 is connected to the first and second line features 92, 94. In some embodiments, each of the via features 91, 93 may include a plurality of via contacts spaced apart from each other, and each of the line features 92, 94 may include a plurality of metal lines spaced apart from each other. Each of the metal lines is coupled to two corresponding ones of the via contacts (for example, each of the metal lines in the line feature 92 is connected to one of the via contacts in the via feature 91 and a corresponding one of the via contacts in the via feature 93).

Each of the via features 91, 93 and the line features 92, 94 has a first surface 901 which is proximate to the base structure 11, a second surface 902 which is distal from the base structure 11, and a connecting surface 903 which is connected between the first and second surfaces 901, 902 and which is covered by the first liner portion 132 of a corresponding one of the first parts 13. The first surface 901 of the first line feature 92 has a first connecting region 9011 which is connected to the first via feature 91 and a first routing region 9012 which extends away from the first connecting region 9011. The first surface 901 of the second line feature 94 is connected to the second via feature 93 in a similar way. It is noted that the first routing region 9012 is further covered by the first line portion 132 of the corresponding one of the first parts 13. Therefore, a breakdown voltage (Vbd) between two adjacent ones of the via contacts in the same one of the via features 91, 93 or a breakdown voltage (Vbd) between two adjacent one of the metal lines in the same one of the line features 92, 94 may be improved due to presence of the first liner portion 132 of a corresponding one of the first parts 13. Furthermore, a breakdown voltage (Vbd) between one of the metal lines in the line feature 92 and a corresponding one of the metal lines in the line feature 94 may be improved due to presence of the first liner portion 132 of a corresponding one of the first parts 13 around the line feature 94.

In some embodiments, the back dielectric unit 12 further includes four etching stop layers 15 disposed to alternate with the four first parts 13. The number of the etching stop layers 15 may vary according to the number of the first parts 13 and practical application requirements. The etching stop layers 15 have an etching selectivity ratio different from that of the first dielectric portion 131, so that trench(s) or via opening(s) for filling the first conductive layers 17 may be well formed without undesirably over-etching. In some embodiments, each of the etching stop layers 15 may be configured as a single layer structure or a multi-layered structure having at least two sub-layers (not shown) stacked on each other. In some embodiments, each of the etching stop layers 15 may include silicon nitride, silicon oxycarbide, silicon carbon nitride, aluminum oxide, aluminum nitride, aluminum oxynitride, other suitable metallic oxides, or combinations thereof. It is noted that the dielectric materials for the etching stop layers 15 are in an amorphous phase so as to have a lower etching rate in the etching process for forming the trench(s) or the via opening(s). For example, amorphous aluminum nitride for forming the etching stop layers 15 has an etching rate which is lower than that of crystalline aluminum nitride for forming the first dielectric portion 131. Other materials suitable for the etching stop layers 15 are within the contemplated scope of the present disclosure. The second surface 902 of the line feature 92 has a second connecting region 9021 which is connected to the second via feature 93 and a second routing region 9022 which extends away from the second connecting region 9021. It is noted that the second routing region 9022 is covered by a corresponding one of the etching stop layers 15. Therefore, in some embodiments, when each of the etching stop layers 15 includes a high breakdown strength material, for example, but not limited to, amorphous aluminum nitride, each of the etching stop layers 15 may have a breakdown field ($E_{br}$) which is greater than that of the first dielectric portion 131, so that a breakdown voltage (Vbd) between one of the metal lines in the line feature 92 and an adjacent one of the metal lines in the line feature 94 may be further improved due to presence of the corresponding etching stop layer 15 which covers the second routing region 9022 of the second surface 902 of the line feature 92.

In some embodiments, the back conductive unit 16 further includes four diffusion barrier layers 19, each of which is disposed between the first liner portion 132 of one of the first parts 13 and a corresponding one of the first conductive layers 17, such that the elements (for example, metal ions/atoms) in the corresponding first conductive layer 17 may be prevented from being diffused to the one of the first parts 13. The number of the diffusion barrier layers 19 may vary according to the number of the first parts 13 and the first conductive layers 17 and practical application requirements. In some embodiments, each of the diffusion barrier layers 19 may be made of tantalum (Ta), tantalum nitride (TaN), Al, aluminum oxide, titanium, titanium nitride, Co, niobium (Nb), lead (Pb), Pt, Ni, Sc. Ru, Mo, W, Ir, Rh, or combinations thereof. Other materials suitable for the diffusion barrier layers 19 are within the contemplated scope of the present disclosure.

In some embodiments, as shown in FIG. 1, the base structure 11 further includes at least one power via 113 (two of which are shown in FIG. 1) disposed in the substrate 111 such that each of the power vias 113 is coupled between one of the device units 112 and an adjacent one of the first conductive layers 17 which is the most proximate to the base structure 11 and which, in some embodiments, serves as the first via feature 91. In some embodiments, possible materials for the power vias 113 are similar to those for the first conductive layer 17, and thus the details thereof are omitted for the sake of brevity. In some other embodiments, each of the power vias 113 may be made of polysilicon highly doped with impurities. In some embodiments, the impurities may include boron. nitrogen, or combinations thereof. In some embodiments, the power vias 113 may be respectively coupled to back-side metal contacts (not shown) of the device units 112 from back sides 112B of the device units 112. In some embodiments, each of the power vias 113 may have a height L0 ranging from about 100 nm to about 300 nm. In some embodiments, in the back conductive unit 16, each of the via features 91, 93 may have a height L1 ranging from about 600 nm to about 1000 nm, and may have a width W1 ranging from about 300 nm to about 500 nm. In some embodiments, each of the line features 92, 94 may have a thickness T1 ranging from about 600 nm to about 1000 nm, and may have a width W2 ranging from about 300 nm to about 500 nm. In some embodiments, each of the etching stop layers 15 disposed on the back surface 111B of the substrate 111 may have a thickness ranging from about 30 to about 50 nm. In some embodiments, each of the diffusion barrier layers 19 may have a thickness ranging from about 5 nm to about 10 nm. In some embodiments, in the back dielectric unit 12, the first liner portion 132 may have a thickness ranging from about 30 to about 50 nm. The thickness of the first liner portion 132 may vary according to the breakdown strength of the first liner portion 132 and a designed distance between two adjacent elements (e.g., the metal lines or the via contacts) which are separated by the first liner portion 132 and the first dielectric portion 131 of the corresponding first part 13. When the first liner portion 132 has a relatively high breakdown strength, the thickness of the first liner portion 132 may be relatively small to achieve an enough breakdown voltage (Vbd) between the two adjacent elements (e.g., the metal lines or the via contacts), and vice versa. When the designed distance is relatively small, the thickness of the first liner portion 132 may be relatively large to achieve an enough breakdown voltage (Vbd), and vice versa. It is noted that the dimension of each of the elements 113, 91, 92, 93, 94, 15, 19, 132 is not limited to the range as described above, and other value ranges are also within the scope of this disclosure, and may vary according to practical applications.

In some embodiments, the semiconductor structure 10 further includes a second dielectric unit 20 disposed on the front surface 111F of the substrate 111 to cover the device units 112, and a second conductive unit 22 disposed in the second dielectric unit 20 and connected to the device units 112. In some embodiments, the second dielectric unit 20 and the second conductive unit 22 shown in FIG. 1 may be referred to as a front dielectric unit and a front conductive unit, respectively. In some embodiments, the front dielectric unit 20 may include a plurality of front dielectric portions 21 stacked on each other, and the front conductive unit 22 may include a plurality of front conductive layers 23 each of which is disposed in a corresponding one of the front dielectric portions 21 so as to permit the device units 112 to be electrically connected to (or to be controlled by) an external circuit through the front conductive layers 23. In some embodiments, the dimension of the front conductive layers 23 may gradually enlarged in a direction away from the substrate 111 so as to permit an outermost one of the front conductive layers 23 to have an enough size for subsequent packaging processes. In some not shown embodiments, each of the power vias 113 in the substrate 111 may further extend into the front dielectric unit 20 so as to couple to one of the front conductive layers 23. In this case, the power vias 113 are respectively coupled to front sides 112F of the device units 112 opposite to the back sides 112B.

In some embodiments, the front dielectric unit 20 may have a relatively low dielectric constant (for example, but not limited to, lower than about 4) to improve RC time delays in the front conductive unit 22. In some embodiments, possible low dielectric constant (low-k) materials for the front dielectric portions 21 may include silicon oxide (SiO$_x$), SiOC-based materials (e.g., SiOCH), borophosphosilicate glass (BPSG), undoped silicate glass (USG), fluorinated silicate glass (FSG), high-density plasma (HDP) oxide, fluorine-doped silicon oxide, carbon-doped silicon oxide, porous silicon oxide, porous carbon-doped silicon oxide, organic polymers, silicone based polymers, or combinations thereof. Other suitable low-k materials for the front dielectric portions 21 are within the contemplated scope of the present disclosure. In some embodiments, the low-k materials for the front dielectric portions 21 may have a relatively low thermal conductivity, which is not conductive to heat dissipation. In some embodiments, the first dielectric portions 131 may have a thermal conductivity which is greater than that of the front dielectric portions 21, and thus heat generated by the device units 112 during operation may be dissipated from the back dielectric unit 12. In some embodiments, the back conductive unit 16 may be connected to a power supply, which may be a direct current (DC) power supply, and thus the performance or behavior of the back conductive unit 16 may be less sensitive to the dielectric constant of the back dielectric unit 12.

Figure 2:
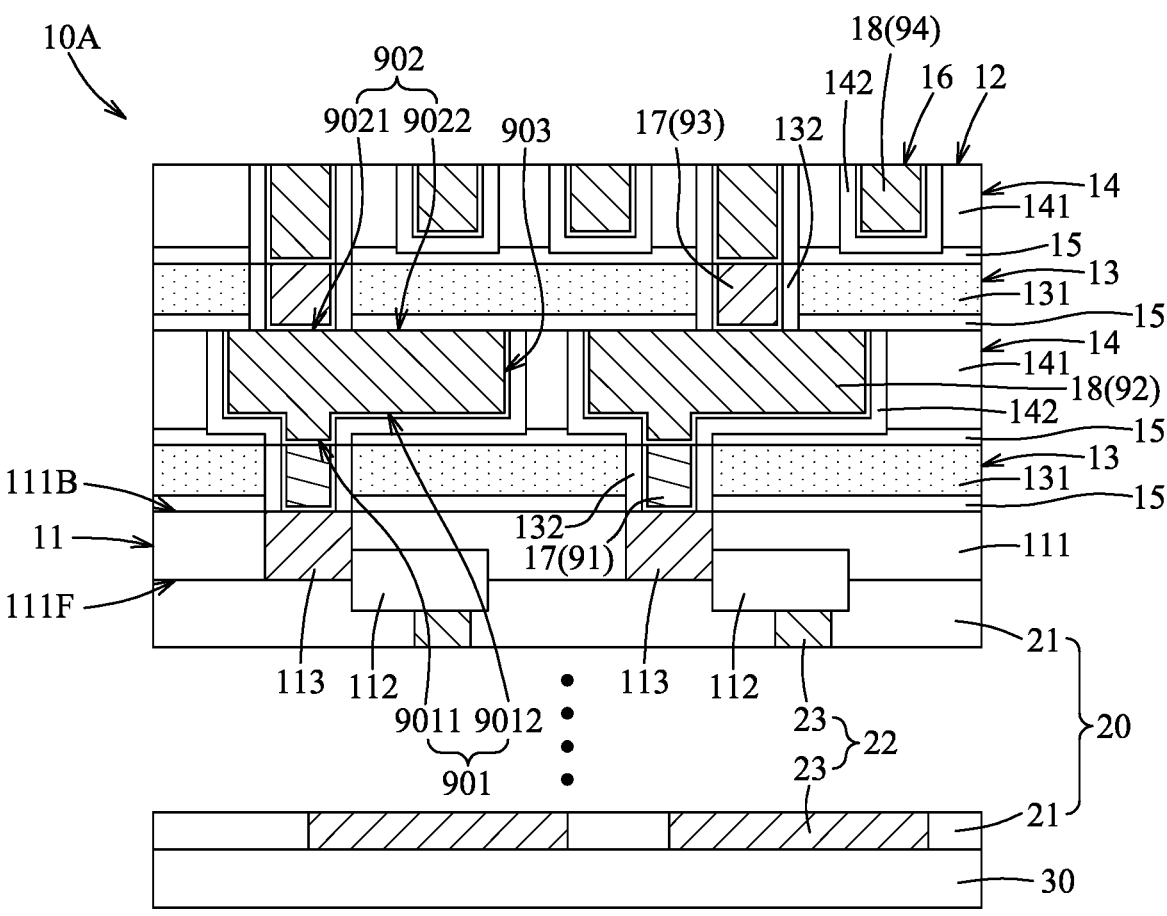
FIGS. 2 to 6 are schematic sectional views illustrating variants of the semiconductor structure in accordance with some embodiments.
Figure 3:
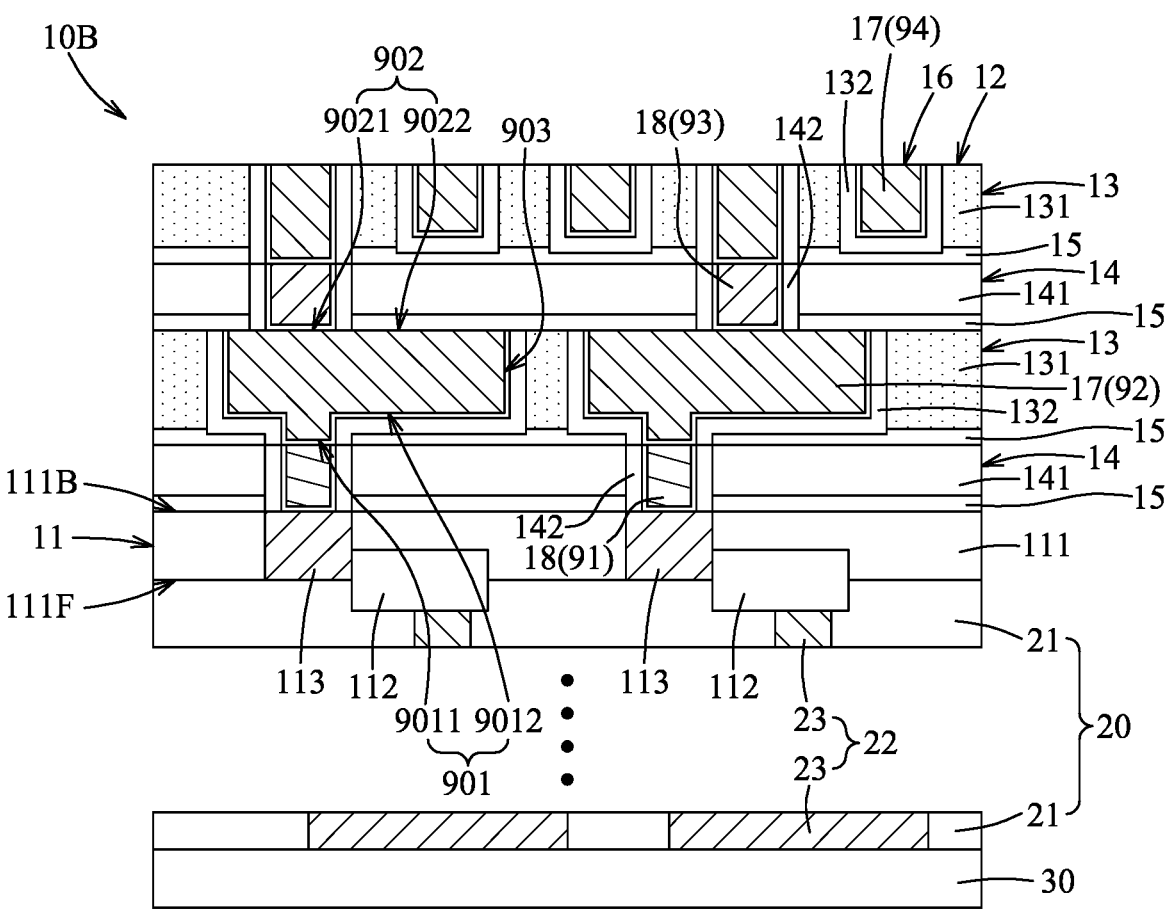

FIGS. 2 and 3 are schematic sectional views respectively illustrating a first variant of the semiconductor structure 10A and a second variant of the semiconductor structure 10B in accordance with some embodiments. It is noted that similar numerals from the above-mentioned embodiments are used where appropriate, with some construction differences being indicated with different numerals.

Each of the semiconductor structures 10A, 10B has a structure similar that of the semiconductor structure 10 shown in FIG. 1, but has the differences as described in the following.

The back dielectric unit 12 further includes at least one second part 14 which is disposed to alternate with the at least one first part 13 and which includes a second dielectric portion 141. The second dielectric portion 141 is made of a high breakdown strength material, and has a breakdown field ($E_{br}$) which is greater than that of the first dielectric portion 131 in the at least one first part 13. In some embodiments, in addition to a relatively high breakdown strength, the second dielectric portion 141 further has a relative low dielectric constant (for example, but not limited to, lower than a dielectric constant of silicon dioxide, i.e., about 4). In some embodiments, the second dielectric portion 141 may include silicon oxide (SiO$_x$), SiOC-based materials (e.g., SiOCH), borophosphosilicate glass (BPSG), undoped silicate glass (USG), fluorinated silicate glass (FSG), high-density plasma (HDP) oxide, fluorine-doped silicon oxide, carbon-doped silicon oxide, porous silicon oxide, porous carbon-doped silicon oxide, organic polymers, silicone based polymers, or combinations thereof. Other suitable materials for the second dielectric portion 141 are within the contemplated scope of the present disclosure.

The back conductive unit 16 further includes at least one second conductive layer 18 which is disposed in the at least one second part 14 and which is connected to the at least one first conductive layer 17. In some embodiments, one of the at least one first conductive layer 17 and the at least one second conductive layer 18 is configured as a line feature which includes a plurality of metal lines spaced apart from each other, and the other one of the at least one first conductive layer 17 and the at least one second conductive layer 18 is configured as a via feature which includes a plurality of via contacts spaced apart from each other. Suitable materials for the at least one second conductive layer 18 are similar to those for the at least one first conductive layer 17 as described above with reference to FIG. 1, and thus the details thereof are omitted for the sake of brevity.

In some embodiments, as shown in FIGS. 2 and 3, the back dielectric unit 12 includes two of the first parts 13 and two of the second parts 14. The back conductive unit 16 includes two of the first conductive layers 17 which are respectively formed in the first parts 13, and two of the second conductive layers 18 which are respectively formed in the second parts 14.

In some embodiments, as shown in FIG. 2, the two first conducive layers 17 are respectively configured as the via features 91, 93, and the two second conductive layer 18 are respectively configured as the line features 92, 94. In some other embodiments, as shown in FIG. 3, the two first conducive layers 17 are respectively configured as the line features 92, 94, and the two second conductive layers 18 are respectively configured as the via features 91, 93.

In some embodiments, each of the second parts 14 further includes a second liner portion 142 which is disposed to separate one of the second conductive layers 18 from the second dielectric portion 141 of a corresponding one of the second parts 14. The second liner portion 142 may be made of a high breakdown strength material, and has a breakdown field ($E_{br}$) which is greater than that of the first dielectric portion 131. Possible high breakdown strength materials for the second liner portion 142 are similar to those for the first liner portion 132, and thus the details thereof are omitted for the sake of brevity. In some embodiments, the first and second liner portions 132, 142 may be made of the same material(s).

In some embodiments, the first liner portion 132 and the second liner portion 142 extend toward and connected to each other. As such, as shown in FIG. 2, the first routing region 9012 of the first surface 901 of the line feature 92 is covered by the second liner portion 142 of a corresponding one of the second parts 14, and as shown in FIG. 3, the first routing region 9012 of the first surface 901 of the line feature 92 is covered by the first liner portion 132 of a corresponding one of the first parts 13. Therefore, as shown in FIG. 2, a breakdown voltage (Vbd) between one of the metal lines in the line feature 92 and an adjacent one of the metal lines in the line feature 94 may be improved due to presence of the second liner portion 142 of a corresponding one of the second parts 14 around the line feature 94; and as shown in FIG. 3, a breakdown voltage (Vbd) between one of the metal lines in the line feature 92 and an adjacent one of the metal lines in the line feature 94 may be improved due to presence of the first liner portion 132 of a corresponding one of the first parts 13 around the line feature 94.

In some alternative embodiments, each of the semiconductor structures 10, 10A, 10B may further include additional features, and/or some features present in the semiconductor structures 10, 10A, 10B may be modified, replaced, or eliminated without departure from the spirit and scope of the present disclosure.

In some embodiments, the back dielectric unit 12 and the back conductive unit 16 in each of the semiconductor structures 10, 10A, 10B may be formed using, for example, but not limited to, a single damascene technique.

Figure 4:
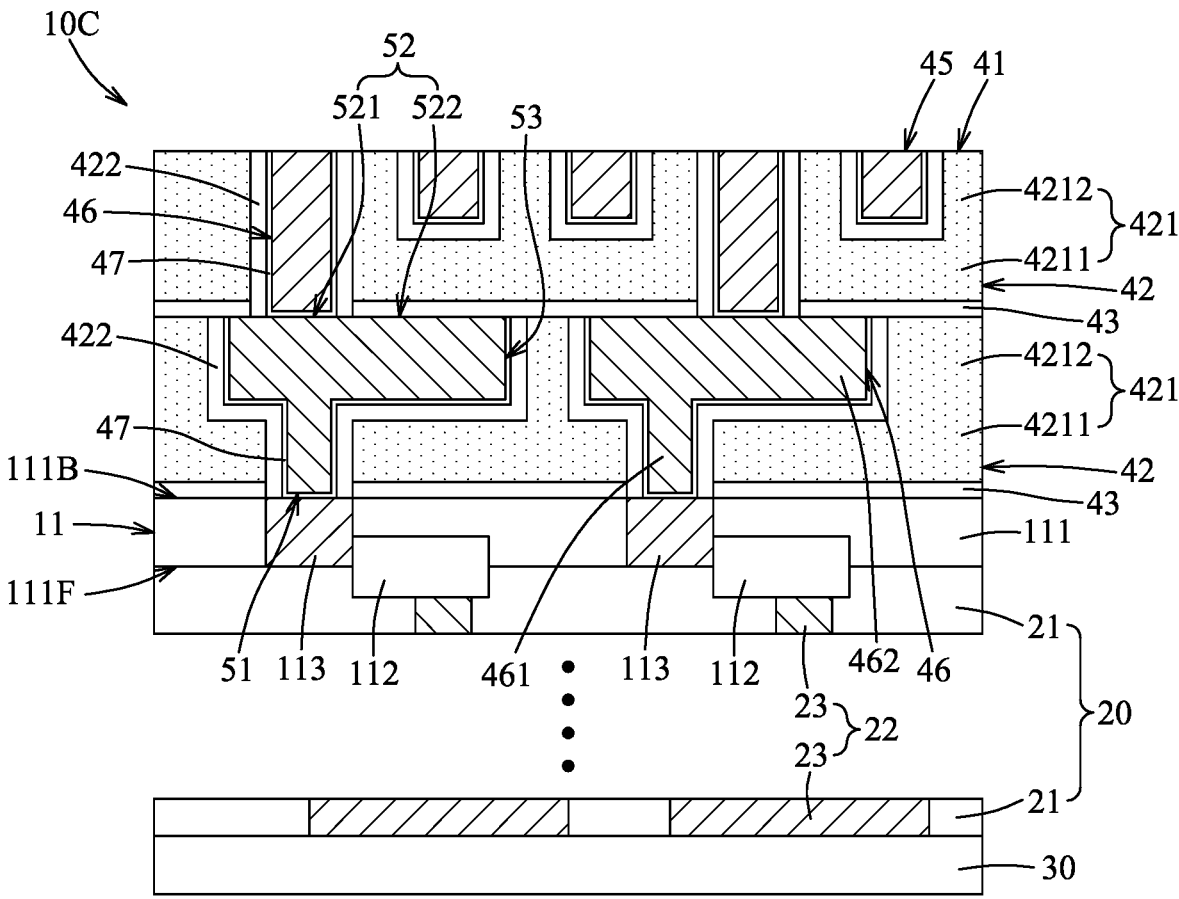
Figure 5:
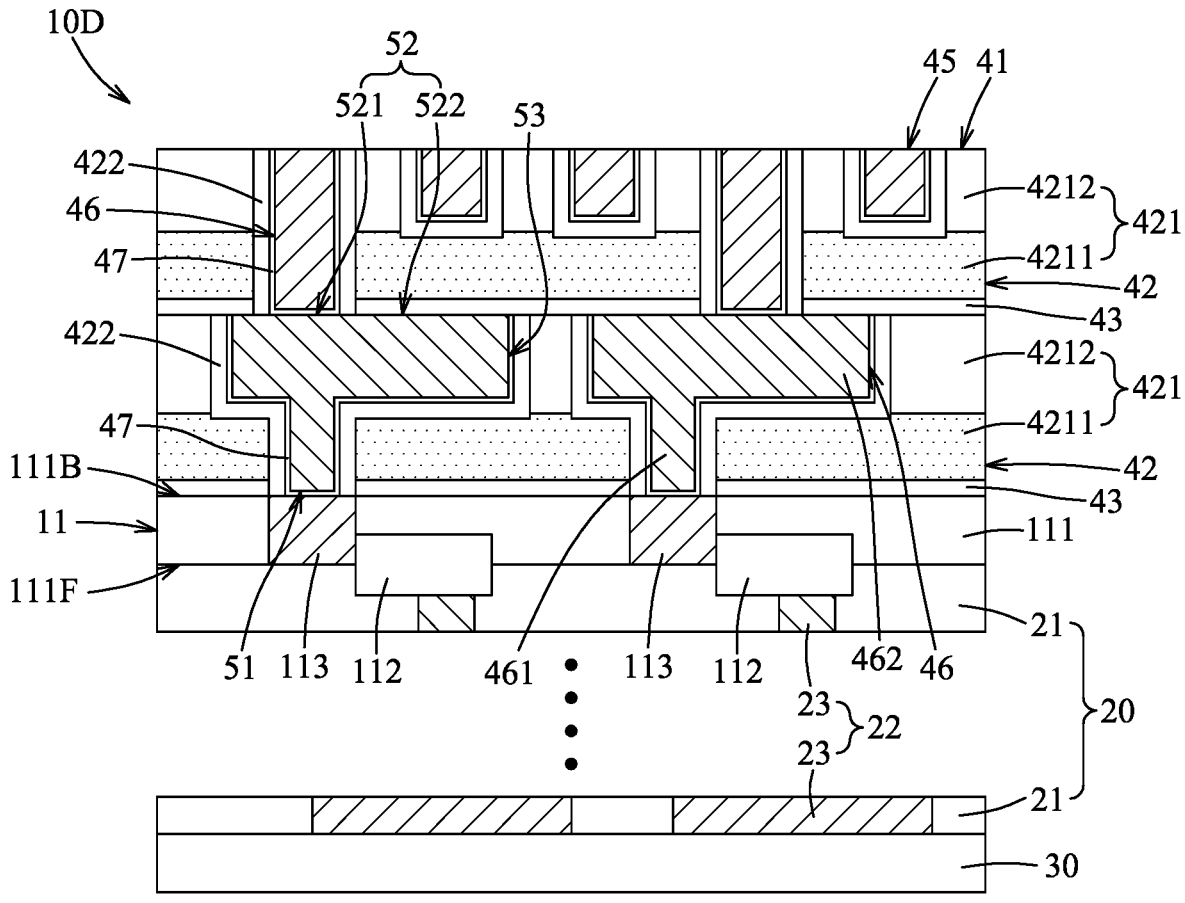
Figure 6:
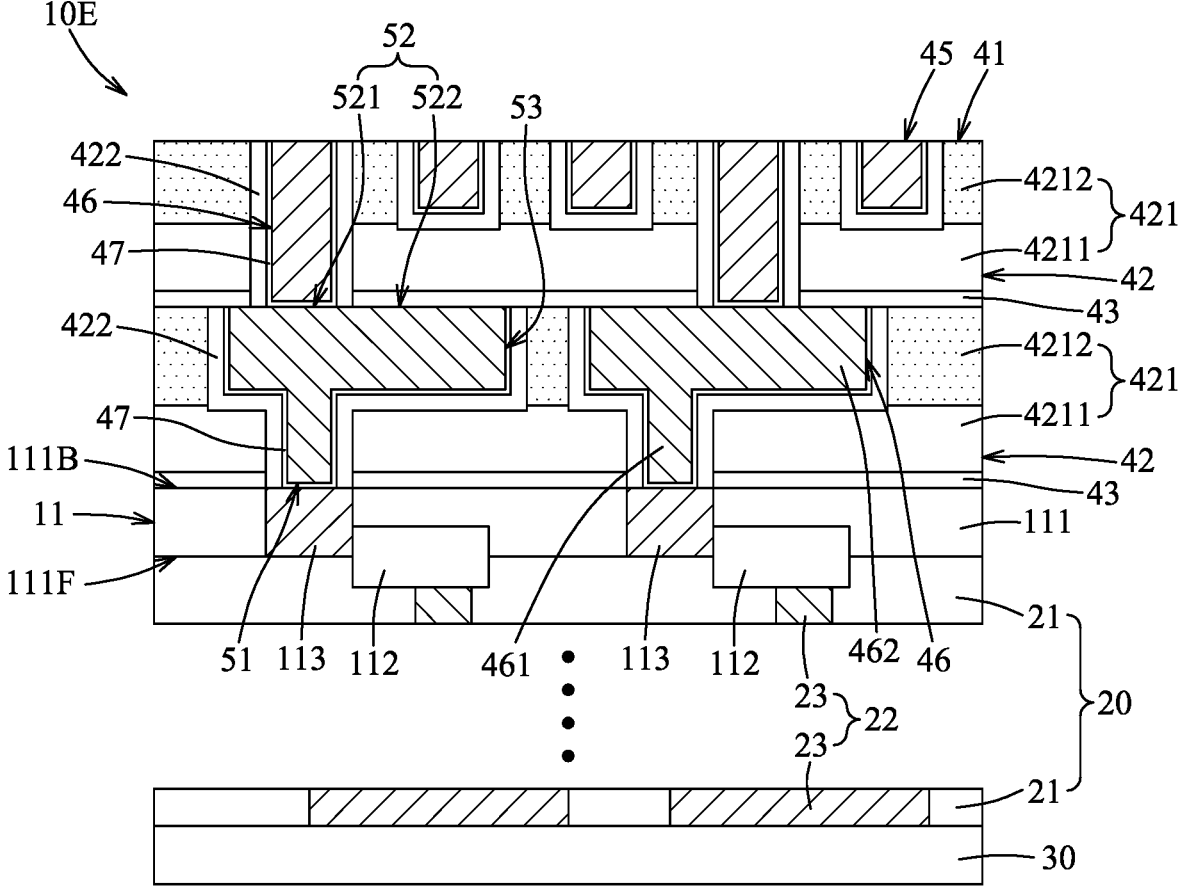

FIGS. 4 to 6 are schematic sectional views respectively illustrating a third variant of the semiconductor structure 10C, a fourth variant of the semiconductor structure 10D and a fifth variant of the semiconductor structure 10E in accordance with some other embodiments. The semiconductor structures 10C, 10D, 10E have structures respectively similar to those of the semiconductor structures 10, 10A, 10B, but have the differences as described below because the semiconductor structures 10C, 10D, 10E may be formed using, for example, but not limited to, a dual damascene technique. It is noted that similar numerals from the above-mentioned embodiments are used where appropriate, with some construction differences being indicated with different numerals.

Each of the semiconductor structures 10C, 10D, 10E includes the base structure 11 including the substrate 111, a first dielectric unit 41 disposed on the substrate 111. and a first conductive unit 45 disposed in the first dielectric unit 41. The details of the base structure 11 are already described above with reference to FIG. 1 and not repeated for the sake of brevity. In some embodiments, the first dielectric unit 41 is disposed on the back surface 111B of the substrate 111 to serve as a back dielectric unit, and the first conductive unit 45 in the back dielectric unit 41 serves as a back conductive unit.

The back dielectric unit 41 includes at least one dielectric part 42 disposed on the substrate 111. The at least one dielectric part 42 includes a main portion 421 including a first region 4211 proximate to the substrate 111 and a second region 4212 distal from the substrate 111. At least one of the first and second regions 4211, 4212 has a thermal conductivity which is greater than about 10 W/mK. In some embodiments, the at least one of the first and second regions 4211, 4212 has a thermal conductivity which is greater than about 100 W/mK. In some embodiments, high thermal conductivity materials suitable for the at least one of the first and second regions 4211, 4212 are similar to those for the first dielectric portion 131 as described above reference to FIG. 1, and thus the details thereof are omitted for the sake of brevity. Specifically, in some embodiments, as shown in FIG. 4, both of the first and second regions 4211, 4212 have a thermal conductivity which is greater than about 10 W/mK. In some other embodiments, as shown in FIG. 5, the first region 4211 has a thermal conductivity which is greater than about 10 W/mK, and the second region 4212 is designed to have a breakdown field ($E_{br}$) which is greater than that of the first region 4211. In some embodiments, possible dielectric materials for the second region 4212 shown in FIG. 5 may be similar to those for the second dielectric portion 141 as described above with reference to FIG. 2, and thus the details thereof are omitted for the sake of brevity. In some yet other embodiments, as shown in FIG. 6, the second region 4212 has a thermal conductivity which is greater than about 10 W/mK, and the first region 4211 is designed to have a breakdown field ($E_{br}$) which is greater than that of the second region 4212. In some embodiments, possible dielectric materials for the first region 4211 shown in FIG. 6 may be similar to those for the second dielectric portion 141 as described above with reference to FIG. 2, and thus the details thereof are omitted for the sake of brevity.

The back conductive unit 45 includes at least one conductive layer 46 disposed in the at least one dielectric part 42. The at least one conductive layer 46 includes a via portion 461 which is disposed in the first region 4211, and a line portion 462 which is coupled to the via portion 461 and which is disposed in the second region 4212. The back conductive unit 45 is electrically conductive. In some embodiments, the via portion 461 includes a plurality of via contacts spaced apart from each other, and the line portion 462 includes a plurality of metal lines spaced apart from each other. Each of the metal lines is coupled to a corresponding one of via contacts. Possible electrically conductive materials for the at least one conductive layer 46 are similar to those for the at least one first conductive layer 17 as described above with reference to FIG. 1, and thus the details thereof are omitted for the sake of brevity.

In some embodiments, the at least one dielectric part 42 further includes a liner portion 422 which is disposed to entirely separate the at least one conductive layer 46 from the first and second regions 4211, 4212, and which has a breakdown field ($E_{br}$) which is greater than that of the at least one of the first and second regions 4211, 4212. Specifically, in some embodiments, as shown in FIG. 4, the liner portion 422 has a breakdown field ($E_{br}$) which is greater than that of each of the first and second regions 4211, 4212. In some other embodiments, as shown in FIG. 5, the liner portion 422 has a breakdown field ($E_{br}$) which is greater than that of the first region 4211. In some yet other embodiments, as shown in FIG. 6, the liner portion 422 has a breakdown field ($E_{br}$) which is greater than that of the second region 4212. Possible dielectric materials for the liner portion 422 are similar to those for the first and second liner portions 132, 142 as described above with reference to FIG. 1, and the details thereof are omitted for the sake of brevity.

In some embodiments, the back dielectric unit 41 further includes at least one etching stop layer 43 disposed to alternate with the at least one dielectric part 42. Possible materials for the at least one etching stop layer 43 are similar to those for the etching stop layers 15 described with reference to FIG. 1, thus the details thereof are omitted for the sake of brevity.

In some embodiments, the back conductive unit 45 further includes at least one diffusion barrier layer 47 which is disposed between the at least one dielectric part 42 and the at least one conductive layer 46. Possible materials for the at least one diffusion barrier layer 47 are similar to those for the diffusion barrier layers 19 as described above with reference to FIG. 1, and thus the details thereof are omitted for the sake of brevity.

In some embodiments, as shown in FIGS. 4 to 6, the first dielectric unit 41 includes two of the dielectric parts 42 (also referred to as upper and lower dielectric parts 42) and two of the etching stop layers 43 (also referred to as upper and lower etching stop layers 43) alternating with the dielectric parts 42, and the back conductive unit 45 includes two of the conductive layers 46 (also referred to as upper and lower conductive layers) respectively disposed in the dielectric parts 42. The upper conductive layer 46 extends through the upper etching stop layer 43 so as to connect to the lower conductive layer 46 disposed therebeneath, and the lower conductive layer 46 extends through the lower etching stop layer 43 so as to connect to the power vias 113.

The lower etching stop layer 43 is disposed between lower dielectric parts 42 and the substrate 111 so as to entirely separate the first region 4211 of the lower dielectric part 42 from the substrate 111. The upper etching stop layer 43 is disposed between the two the dielectric parts 42 so as to entirely separate the second region 4212 of the lower dielectric part 42 and the first region 4211 of the upper dielectric part 42. In some embodiments, the lower conductive layer 46 has a first surface 51 which is proximate to the base structure 11, a second surface 52 which is distal from the base structure 11, and a connecting surface 53 which is connected between the first and second surfaces 51, 52 and which is covered by the liner portion 422 of the lower dielectric part 42. The via portion 461 and the line portion 462 of the lower conductive layer 46 have the first surface 51 and the second surface 52, respectively. The second surface 52 has a connecting region 521 which is connected to the via portion 461 of the upper conductive layer 46, and a routing region 522 which extends away from the connecting region 521 and which is covered by the upper etching stop layer 15.

In some embodiments, as shown in FIGS. 4 to 6, the back conductive unit 45 includes two of the diffusion barrier layers 47 (also referred to as upper and lower diffusion barrier layers), each of which is disposed between one of the dielectric parts 42 and a corresponding one of the conductive layers 46.

In some alternative embodiments, each of the semiconductor structures 10C, 10D, 10E may further include additional features, and/or some features present in the semiconductor structures 10C, 10D, 10E may be modified, replaced, or eliminated without departure from the spirit and scope of the present disclosure. For example, each of the semiconductor structures 10C, 10D, 10E may further include the front dielectric unit 20 disposed on the front surface 111F of the substrate 111 to cover the device units 112, and the front conductive unit 22 disposed in the front dielectric unit 20 and connected to the device units 112. The details of the second dielectric unit 20 and the second conductive unit 22 are already described above with reference to FIG. 1 and not repeated for the sake of brevity.

In addition, in the case that the high thermal conductivity material (having a thermal conductivity which is higher than about 10 W/mK or about 100 W/mK) used in the back dielectric unit 12 or 41 described with reference to FIGS. 1 to 6 also has a relatively low dielectric constant (e.g., lower than about 4), an additional dielectric unit, which has a configuration similar to that of the back dielectric unit 12 or 41 shown in one of FIGS. 1 to 6, may be disposed on the front surface 111F of the substrate 111 to cover the device units 112 for replacement of the front dielectric unit 20 shown in one of FIGS. 1 to 6.

Figure 7:
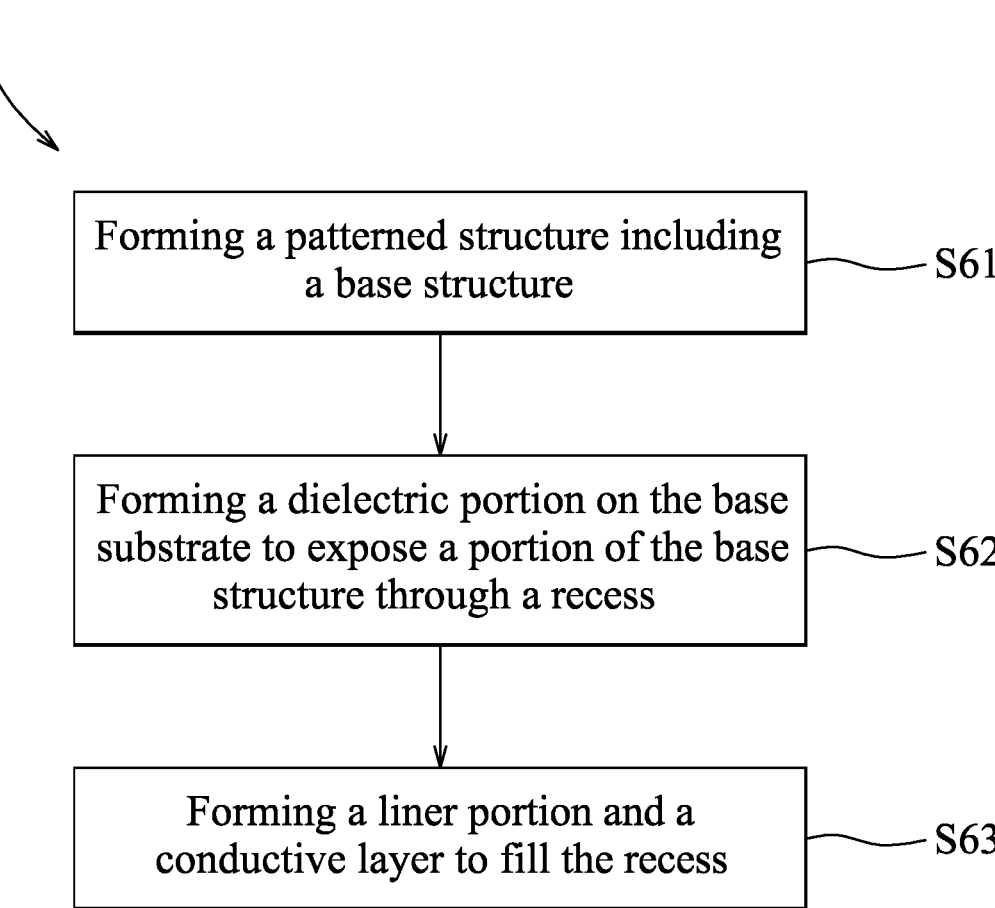
FIG. 7 is a flow diagram illustrating a method for manufacturing a semiconductor structure in accordance with some embodiments.

FIG. 7 is a flow diagram illustrating a method 6 for manufacturing a semiconductor structure in accordance with some embodiments. FIGS. 8 to 16 illustrate schematic views of intermediate stages of the method 6 for manufacturing, for example, but not limited to, the semiconductor structures 10C, 10D respectively shown in FIGS. 4 and 5 in accordance with some embodiments. It is noted that similar numerals from the above-mentioned embodiments are used where appropriate, with some construction differences being indicated with different numerals.

In some embodiments, the method 6 may include steps S61 to S63.

Referring to FIG. 7, the method 6 proceeds to step S61, where a patterned structure including a base structure is formed. Referring to the example illustrated in FIG. 9, a patterned structure 60 is provided for forming the base structure 11.

Figure 8:
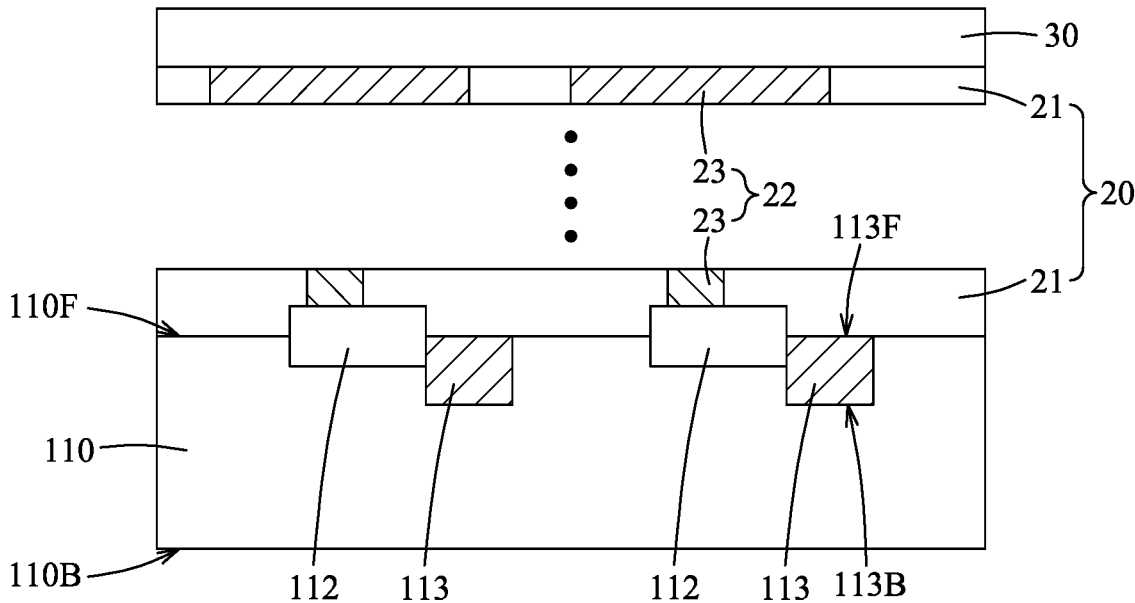
FIGS. 8 to 21 illustrate schematic views of intermediate stages of the method depicted in FIG. 7 in accordance with some embodiments.
Figure 9:
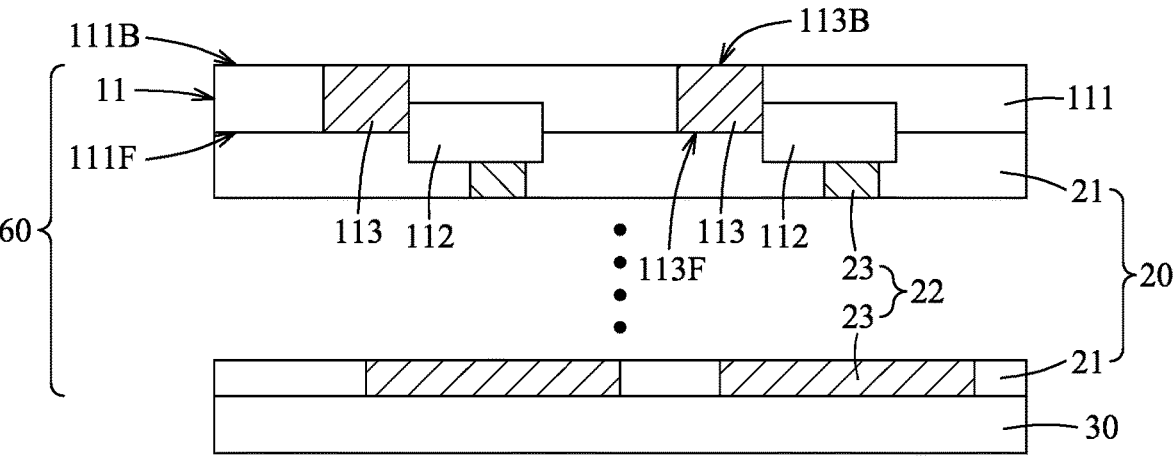

In some embodiments, formation of the patterned structure 60 may include (i) forming the power vias 113 in a starting substrate 110 using one or more photolithography processes for forming patterned photomask(s) or patterned hark mask(s) (such as coating a photoresist, exposing the photoresist through a photomask, developing the photoresist, etching the starting substrate 110 (and the hard mask(s), if any) using the photoresist, stripping or ashing the photoresist, and/or other suitable processes), one or more etching processes in the photolithography process(es) (such as deep reactive ion etching (DRIE) using fluorine-containing plasma, a laser drilling, or other suitable etching process), one or more deposition processes (such as electroless plating, electroplating, physical vapor deposition (PVD), chemical vapor deposition (CVD), or other suitable deposition processes), and a planarization process (such as chemical mechanical planarization (CMP), or other suitable planarization processes) such that a front surface 113F of each of the power vias 113 is exposed from a front surface 110F of the starting substrate 110, as shown in FIG. 8, (ii) forming the device units 112 on the front surface 110F of the starting substrate 110 using any suitable process techniques, for example, one or more deposition processes (such as CVD, atomic layer deposition (ALD), other suitable processes, or combinations thereof), one or more photolithography processes for forming patterned photomask(s) or patterned hark mask(s) (such as coating a photoresist, exposing the photoresist through a photomask, developing the photoresist, etching using the photoresist, stripping or ashing the photoresist, and/or other suitable processes), one or more etching processes for patterning (such as dry etching, wet etching, other suitable processes, combinations thereof), and/or one or more planarization processes (such as, CMP, or other suitable processes) according to structural designs of the device units 112, as shown in FIG. 8, (iii) forming the front dielectric unit 20 disposed on the front surface 110F the starting substrate 110 to cover the device units 112 and forming the front conductive unit 22 in the front dielectric unit 20 using a dual damascene process, a single damascene process, or other suitable back-end-of-line (BEOL) techniques, as shown in FIG. 8, (iv) forming a carrier portion 30 on a surface of the front dielectric unit 20 opposite to the starting substrate 110 so as to cover the front conductive unit 22, as shown in FIG. 8, (v) flipping the starting substrate 110 and the elements 112, 113, 20, 22 formed thereon or formed therein through the carrier portion 30, as shown in FIGS. 8 and 9, and (vi) removing a back portion of the starting substrate 110 using a planarization process (such as, CMP, or other suitable processes) and one or more etching processes (such as dry etching, wet etching, other suitable processes, combinations thereof) to expose a back surface 113B of each of the power vias 113 opposite to the front surface 113F such that the starting substrate 110 is patterned into the substrate 111 as described above with reference to FIG. 1, thereby obtaining the patterned structure 60. Other suitable processes for forming the patterned structure 60 are within the contemplated scope of the present disclosure. For example, in some other embodiments, the power vias 113 may be formed after the removal of the back portion of the starting substrate 110.

The structural details of the base structure 11, the back dielectric unit 20 and the back conductive unit 22 are already described above with reference to FIG. 1, and not repeated for the sake of brevity. In some embodiments, the carrier portion 30 may include epoxy resin which may be formed on the second dielectric unit 20 by spin-coating or tape casting. In some other embodiments, the carrier portion 30 may include a carrier substrate (for example, but not limited to, a silicon substrate) bonded to the front dielectric unit 20 and the front conductive unit 22 using a suitable bonding techniques.

Referring to FIG. 7, the method 6 proceeds to step S62, where a dielectric portion is formed on the substrate. Referring to the examples illustrated in FIGS. 12 and 13, the main portion 421 of the dielectric part 42 (see also FIGS. 4 and 5) are formed on the back surface 111B of the substrate 111.

In some embodiments, step S62 may include sub-steps S601 to S603.

Figure 10:
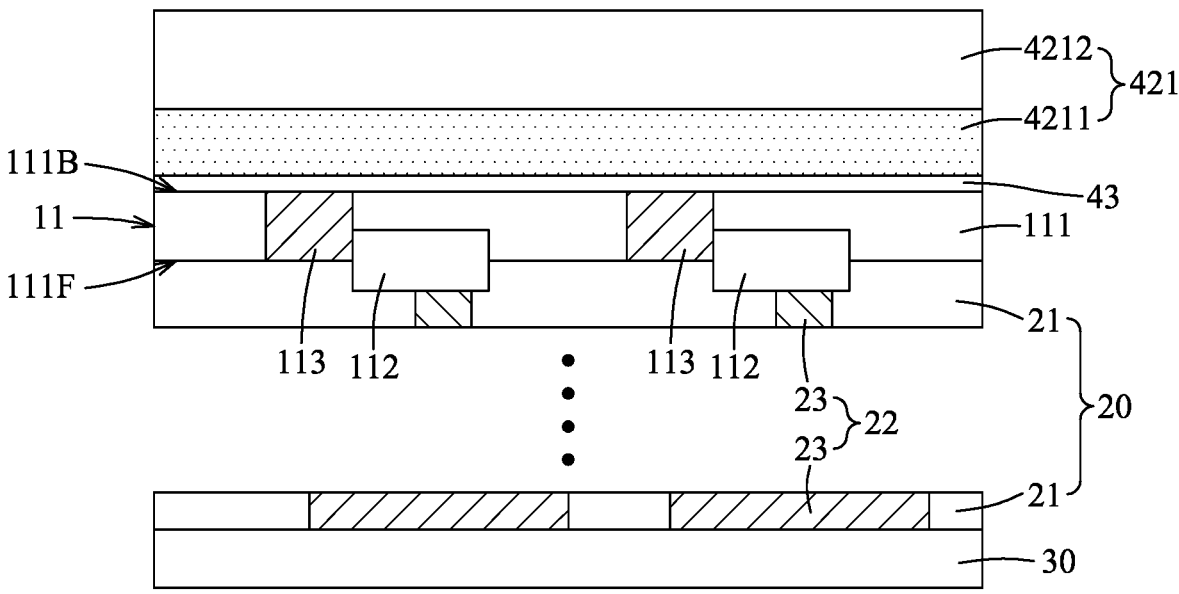

In sub-step S601, the lower etching stop layer 43 is formed on the back surface 111B of the substrate 111 by CVD, ALD, or other suitable deposition processes, as shown in FIGS. 9 and 10.

In sub-step S602, the first region 4211 and the second region 4212 of the main portion 421 are sequentially formed on the lower etching stop layer 43 using a deposition process (such as the examples as described in the preceding paragraph). In some embodiments, the first and second regions 4211, 4212 may be made of different materials, and one of the first and second regions 4211, 4212 (for example, the first region 4211 as shown in FIG. 10) is made of a high thermal conductivity material (such as the examples as described above with reference to FIG. 1). In some other embodiments, as shown in FIG. 11, the first and second regions 4211, 4212 may be made of the same high thermal conductivity material (such as the examples as described above with reference to FIG. 1).

Figure 11:
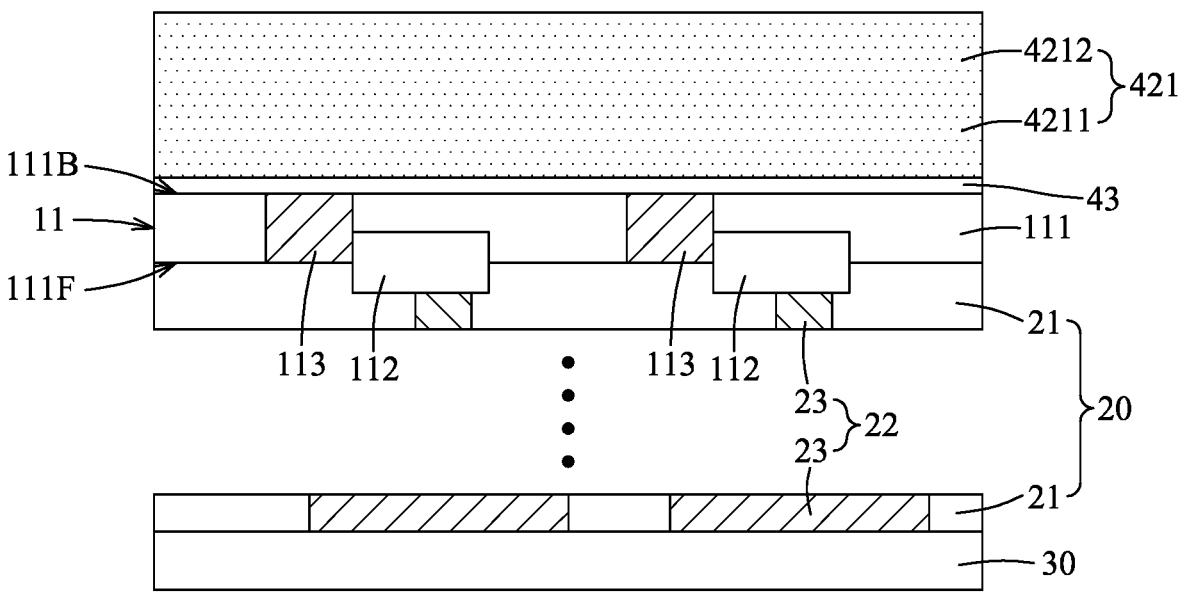
Figure 12:
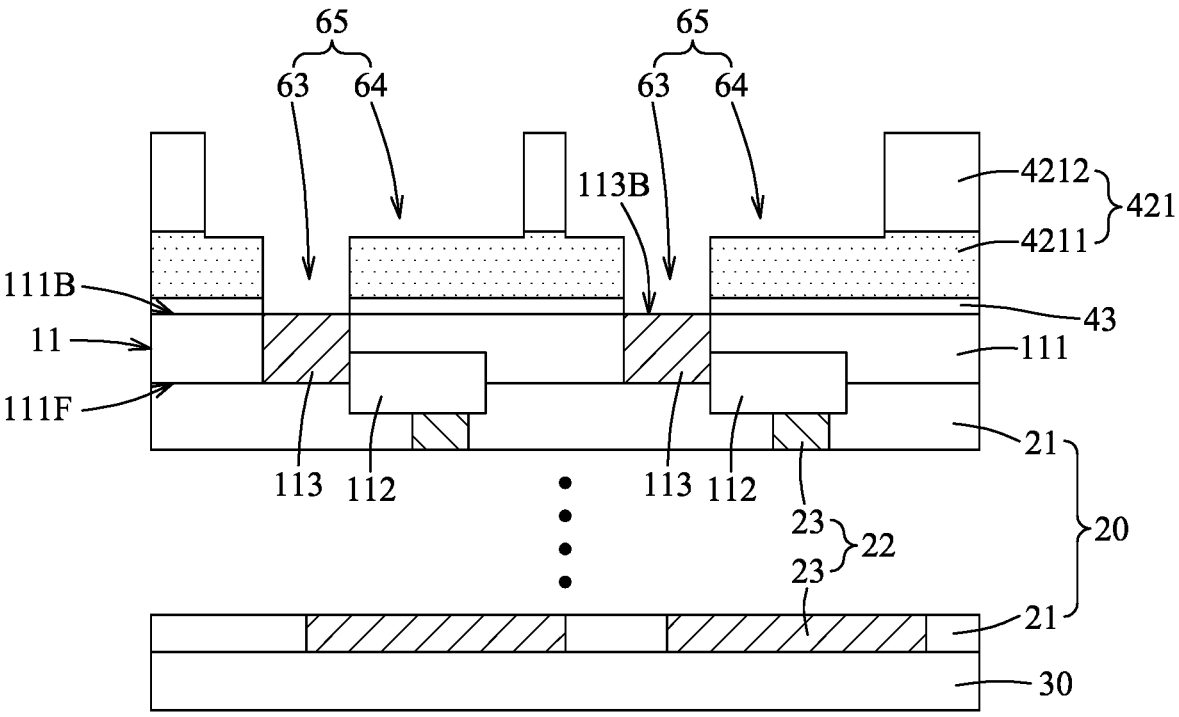
Figure 13:
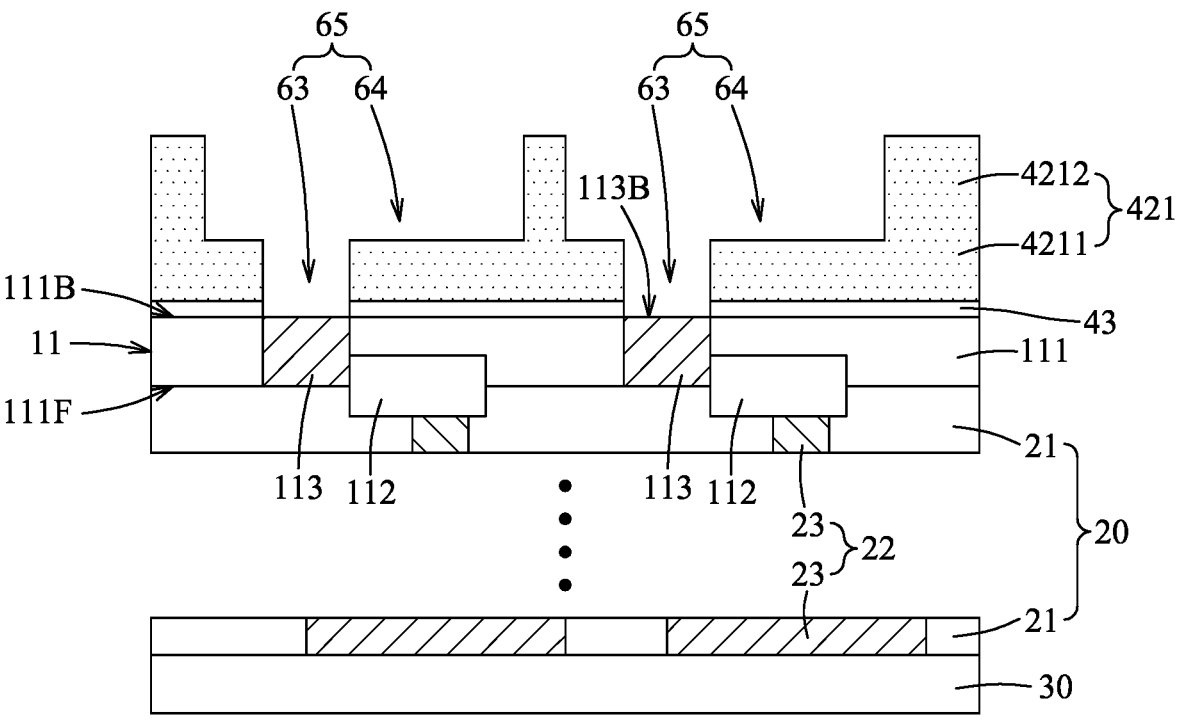

In sub-step S603, a plurality of via opening 63 are formed in the first region 4211, and a plurality of trenches 64 are formed in the second region 4212 using one or more patterning processes (for example, but not limited to, a dry etching process, a wet etching process, or a combination thereof) through one or more patterned photoresist and/or hard mask (not shown), and hence the structure shown in FIG. 10 is formed into the structure shown in FIG. 12, and the structure shown in FIG. 11 is formed into the structure shown in FIG. 13. The trenches 64 are recessed downwardly from a top surface of the second region 4212, and the via openings 63 are respectively disposed below and in spatial communication with the trenches 64 to expose the back surface 113B of each of the power vias 113, thereby obtaining a plurality of integrated recesses 65 each of which includes one of the via openings 63 and a corresponding one of the trenches 64. In some embodiments, the first region 4211 may be served as an etching stop layer during formation of the trenches 64 due to different etching selectivity ratios between the first and second regions 4211, 4212, as shown in FIG. 12. In some other embodiments, when the first and second regions 4211, 4212 are made of the same material, formation of the trenches 64 may be a time-controlled etching process so that the etching is stopped after a period of time so as to prevent the first region 4211 from being undesirably over-etched, as shown in FIG. 13.

Referring to FIG. 7, the method 6 proceeds to step S63, where a liner portion and a conductive layer are formed to fill the recesses. Referring to the examples illustrated in FIGS. 16 and 17, the liner portion 422 is formed on inner surfaces of the recesses 65 (see also FIGS. 12 and 13), the via portion 461 of the conductive layer 46 is formed in the via openings 63 (see also FIGS. 12 and 13), and the line portion 462 of the conductive layer 46 is formed in the trenches 64 (see also FIGS. 12 and 13).

In some embodiments, step S63 may include sub-steps S604 and S605.

Figure 14:
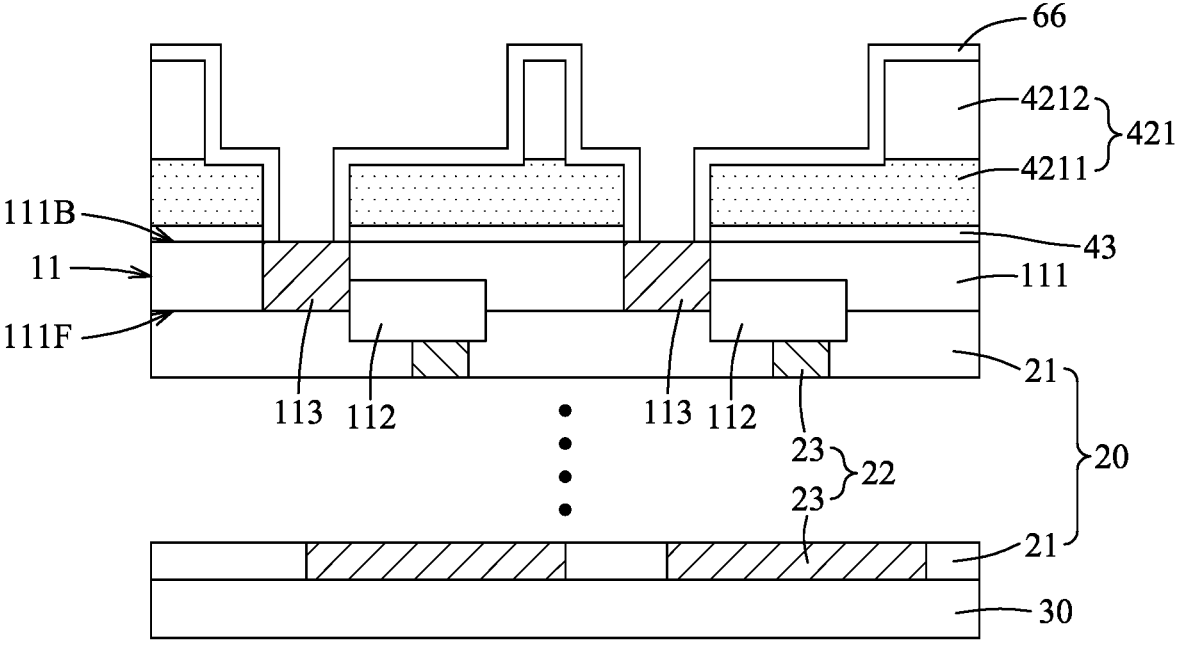
Figure 15:
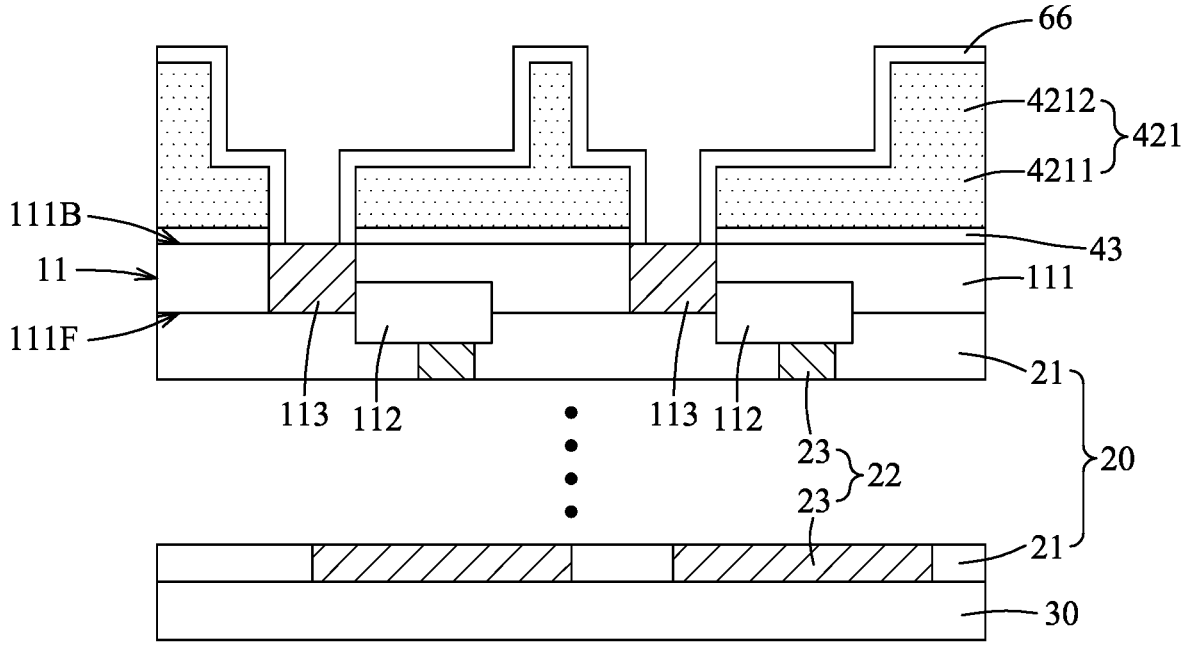

In sub-step S604, a liner layer 66 for forming the liner portion 422 is formed on the structure after step S62 (e.g., the structure shown in FIG. 12 or the structure shown in FIG. 13) to expose the back surface 113B of each of the power vias 113, and hence the structure shown in FIG. 12 is formed into the structure shown in FIG. 14, and the structure shown in FIG. 13 is formed into the structure shown in FIG. 15. In some embodiments, the liner layer 66 may be formed using a deposition process, followed by a patterning process (such as the examples as described in the preceding paragraph) to expose the back surface 113B of each of the power vias 113. In some other embodiments, formation of the liner layer 66 may be performed using a selectively deposition process, and may include (i) selectively forming a blocking layer (not shown) to cover the back surface 113B of each of the power vias 113 so as to reduce a deposition rate of the liner layer 66 on the power vias 113, and (ii) selectively forming the liner layer 66 on the inner surface of the recesses 65 and the upper surface of the second region 4212 but not on the power vias 113. In some embodiments, the blocking layer may be made of a self-assembled monolayer (SAM) which can be selectively formed on a metallic material or a native oxide layer which is naturally formed on the metallic material. In some embodiments, the SAM material includes a head group which contains phosphorus (P), sulfur (S), or silicon (Si) and a tail group which is connected to the head group and which contains an organic chain, such as hydrocarbon chain (CHx) or the like. In some embodiments, the head group of SAM may include phosphate, sulfate, or silane based materials. In some embodiments, SAM may include benzotriazole (BTA), phosphonic acid, octadecylphosphonic (ODPA), organosulfur compound, thiol (e.g., dodecanethiol, alkanethiol, or the like), etc. After sub-step S604, the blocking layer will be decomposed or removed by a thermal process.

Figure 16:
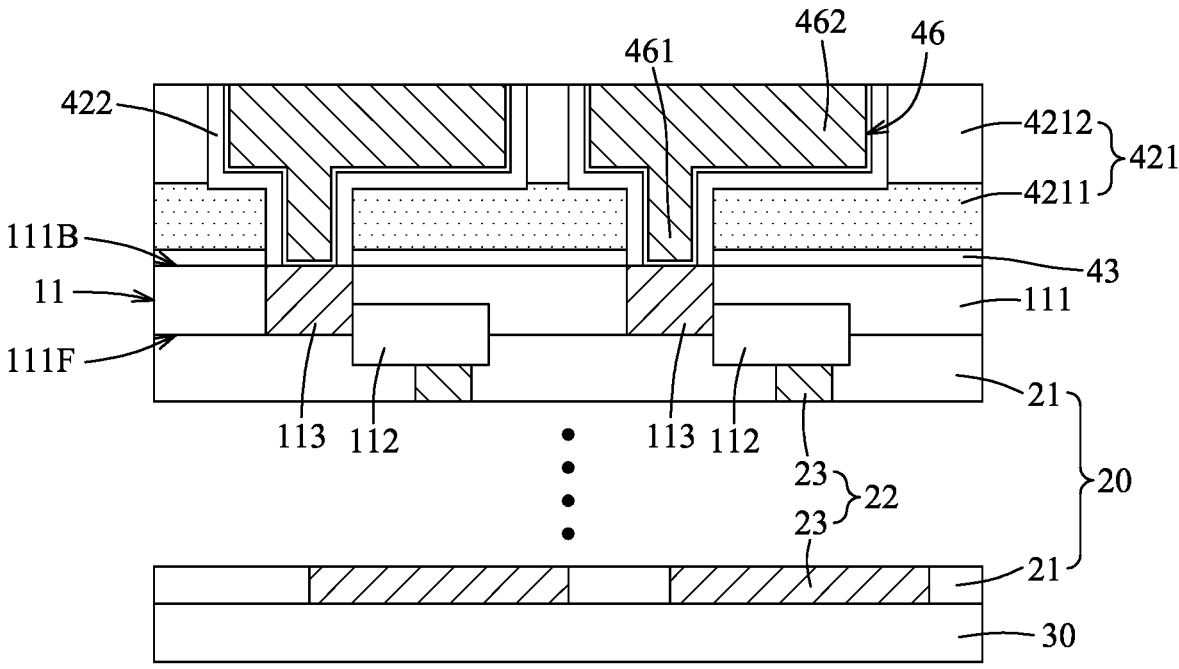
Figure 17:
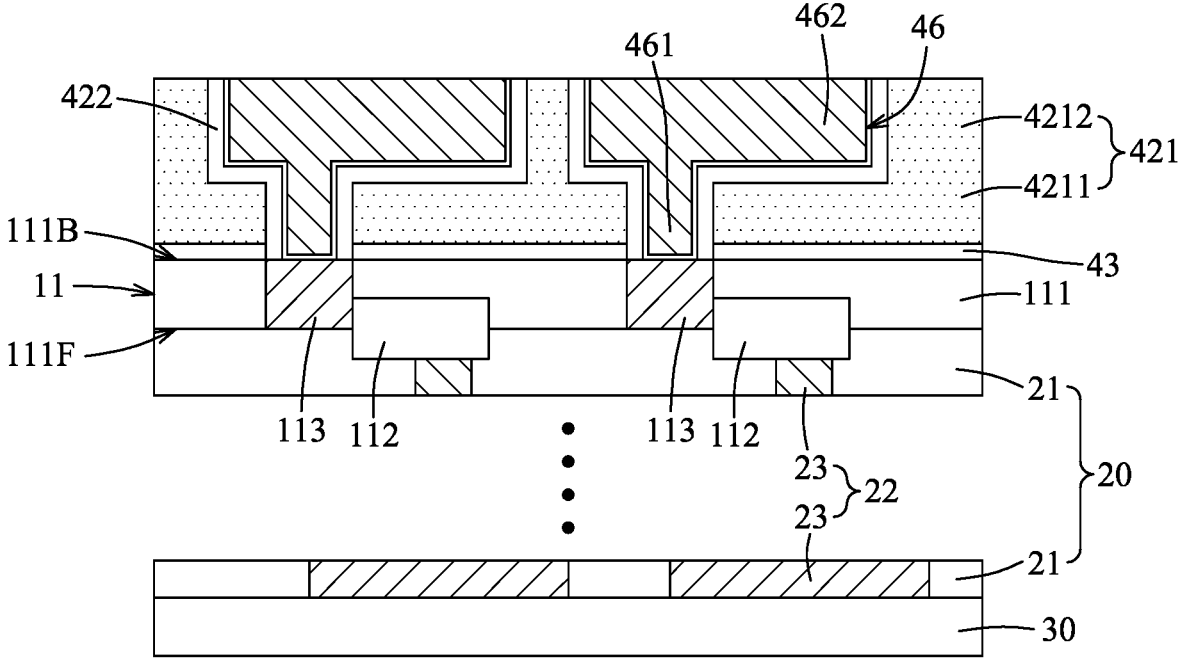

In sub-step S605, an electrically conductive material for the lower conductive layer 46 (see also FIGS. 4 and 5) is formed on the liner layer 66 (see FIGS. 14 and 15) to fill the recesses 65 using electroless plating, electroplating, PVD, CVD, or other suitable deposition processes, followed by a planarization process (for example, but not limited to, CMP) to expose the second region 4212, and hence the structure shown in FIG. 14 is formed into the structure shown in FIG. 16, and the structure shown in FIG. 15 is formed into the structure shown in FIG. 17. The liner layer 66 is formed into the line portion 422 of the lower dielectric part 42, and the electrically conductive material for the lower conductive layer 46 is formed into the via portion 461 and the line portion 462 of the lower conductive layer 46.

In some embodiments, a material layer for the lower diffusion barrier layer 47 (see also FIGS. 4 and 5) may be further formed after sub-step S604 and before sub-step 605, and thus the lower diffusion barrier layer 47 can be formed between the lower conductive layer 46 and the liner portion 422 of the lower dielectric part 42.

In some embodiments, the structures respectively shown in FIGS. 16 and 17 may be respectively formed into the semiconductor structures 10D, 10C respectively shown in FIGS. 5 and 4 in a manner similar to that described in steps S62 and S63, and thus the details thereof are omitted for the sake of brevity.

In some embodiments, some steps in the method 6 may be modified, replaced, or eliminated without departure from the spirit and scope of the present disclosure.

Figure 18:
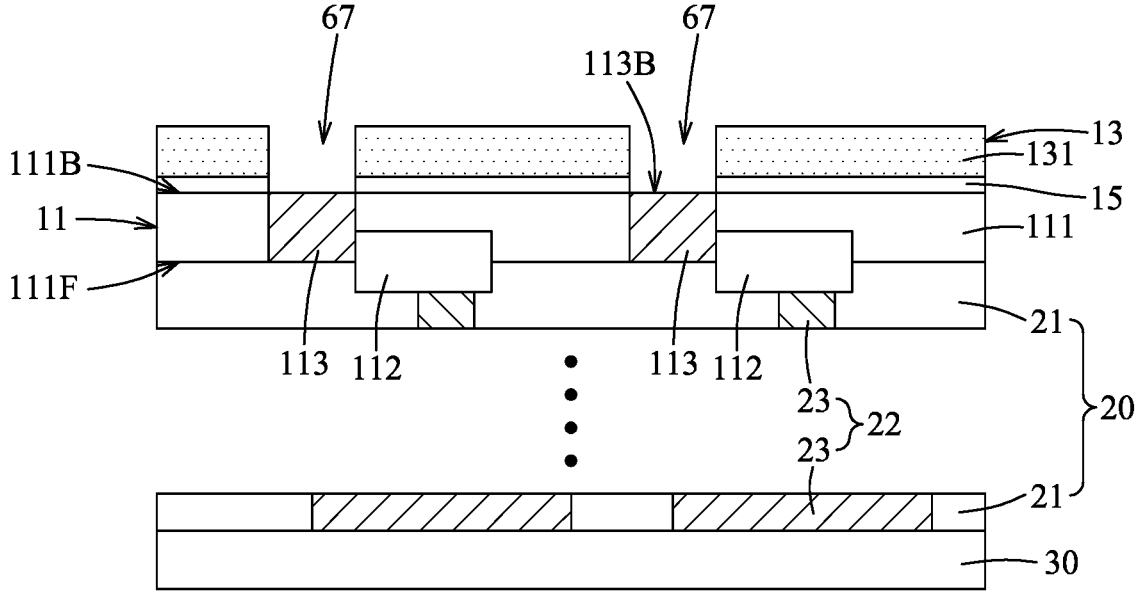

For example, in some embodiments, the method 6 illustrated with reference to FIGS. 8 to 16 is used in a dual damascene technique, however, the method 6 may also be used in a single damascene technique. In the following, for better description, two of the etching stop layers 15 (for example, those shown in FIG. 1, 2, or 3), which are proximate to the base structure 11 relative to the other two of the etching layers 15, are referred to as, in the direction away from the base structure 11, the lower and upper etching stop layers 15. Other elements (such as elements 13, 17, 19 and so on) are also referred in a similar manner. In addition, a lower one of the first parts 13 and a lower one of the second parts 14 shown in FIG. 2 are respectively referred to as the lower first part 13 and the lower second part 14. In some embodiments, for forming the semiconductor structure 10 shown in FIG. 1, in step 62, referring to the example illustrated in FIG. 18, the lower etching stop layer 15 and the first dielectric portion 131 of the lower first part 13 are sequentially formed on the back surface 111B of the substrate 111 to expose the back surfaces 113B of the power vias 113 through a plurality of via openings 67 in a manner similar to that described in step S62 (e.g., deposition process (es) followed by patterning process(es)). Afterwards, in step S63, referring to the examples illustrated in FIG. 19, the first liner portion 132 of the lower first part 13 is formed on inner surfaces of the via openings 67, and the lower diffusion barrier layer 19 and the lower first conductive layer 17 (i.e., the via feature 91, see also FIG. 2) are sequentially formed to fill the recesses 67 and connected to the power vias 113 in a manner similar to that described in step S63 (e.g., deposition process(es) followed by a planarization process). Subsequently, the structure shown in FIG. 19 may be formed into the semiconductor structure 10 shown in FIG. 1 by further repeating steps S62 and S63, and thus the details thereof are omitted for the sake of brevity.

Figure 19:
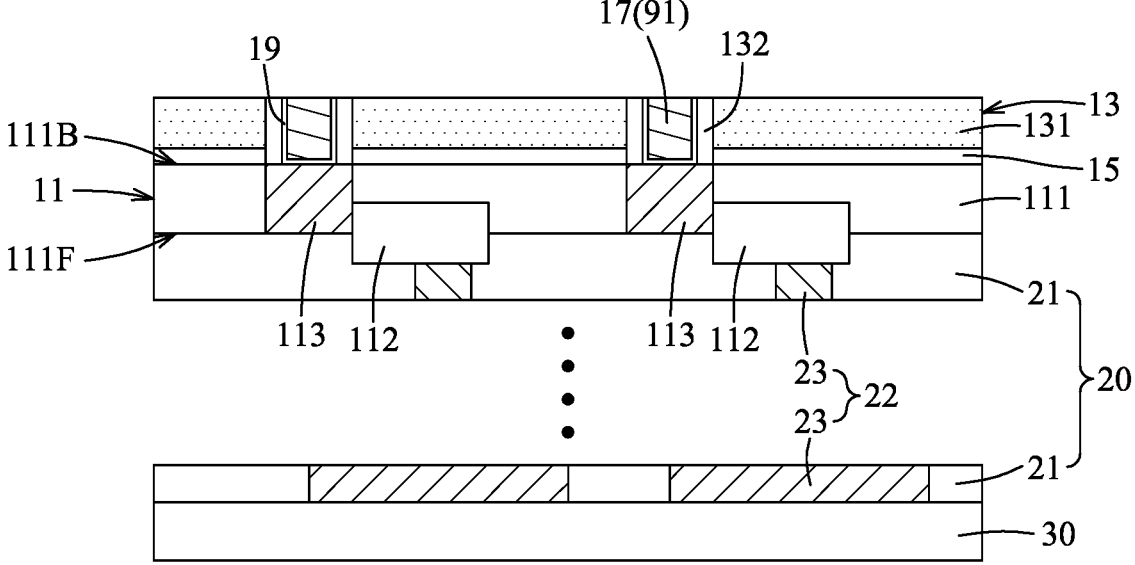
Figure 20:
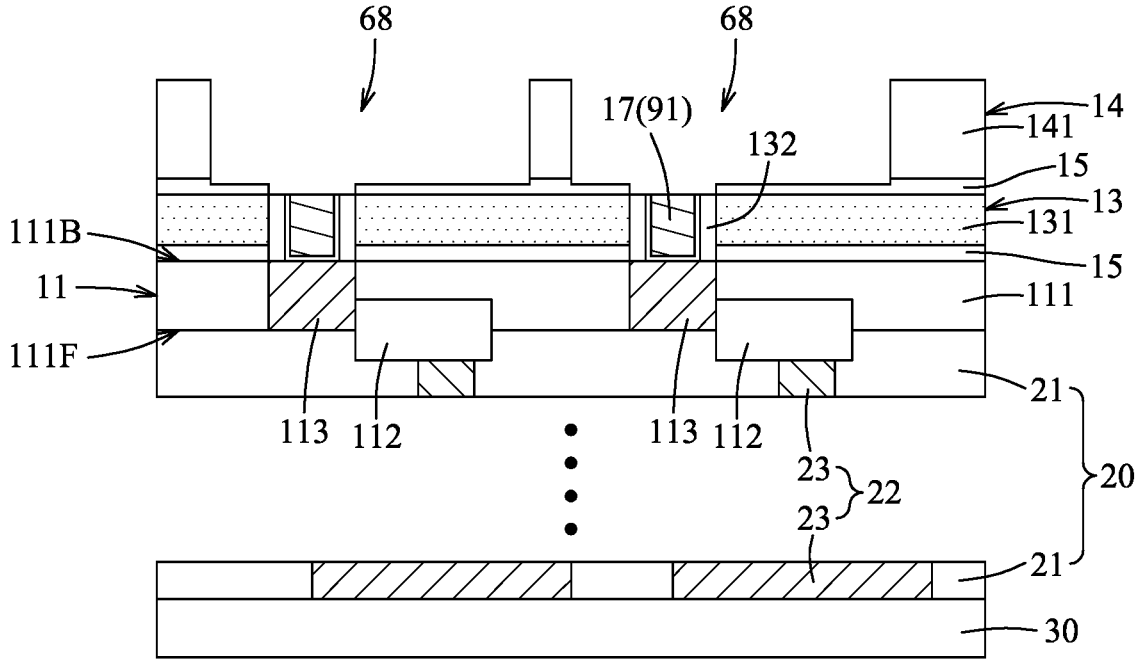
Figure 21:
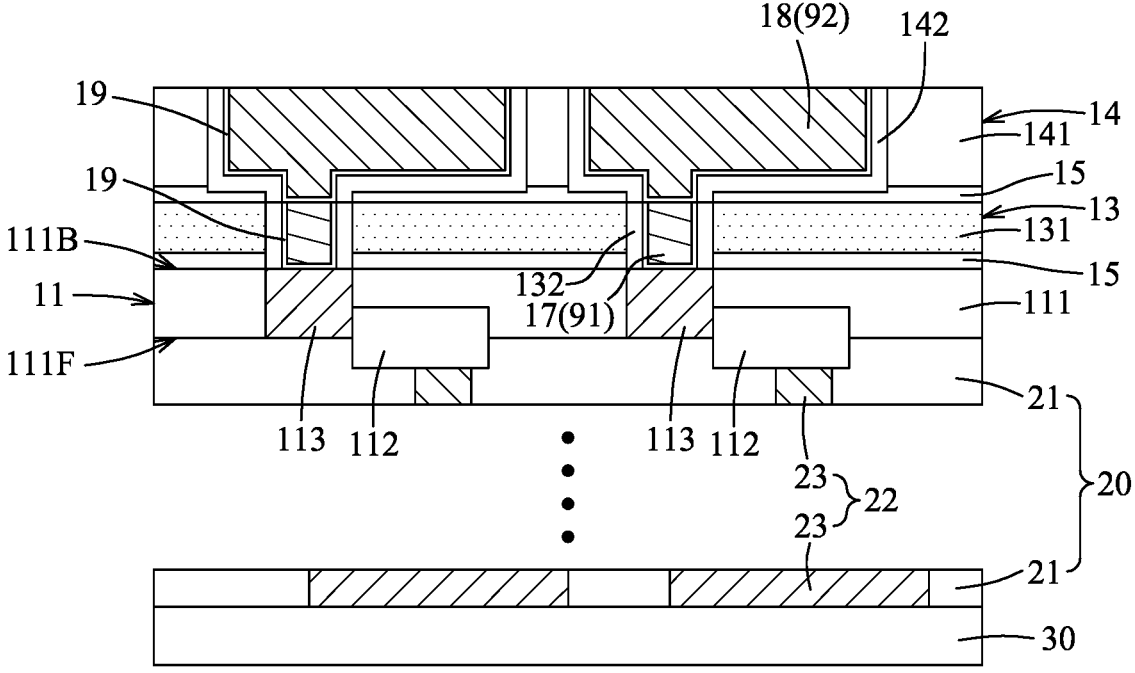

In some embodiments, for forming the semiconductor structure 10A shown in FIG. 2, as shown in FIG. 20, the upper etching stop layer 15 and the second dielectric portion 141 of the lower second part 14 (see also FIG. 2) are sequentially formed on the structure shown in FIG. 19 to expose the lower first conductive layer 17 through a plurality of trenches 68 in a manner similar to that described in step S62 (e.g., deposition process(es) followed by patterning process(es)). Afterwards, as shown in FIG. 21, the second liner portion 142 of the lower second part 14 is formed on inner surfaces of the trenches 68, and the upper diffusion barrier layer 19 and the upper first conductive layer 17 (i.e., the line feature 92, see also FIG. 2) are sequentially formed to fill the trenches 68 and connected to the lower first conductive layer 17 in a manner similar to that described in step S63 (e.g., deposition process(es) followed by a planarization process). Subsequently, the structure shown in FIG. 21 may be formed into the semiconductor structure 10 shown in FIG. 2 by further repeating steps S62 and S63, and thus the details thereof are omitted for the sake of brevity.

In this disclosure, with the introduction of the high thermal conductive materials as an inter-metal dielectric, a heat generated during operation of an integrated circuit may be efficiently dissipated through the back dielectric unit. Further, with the introduction of the high breakdown strength materials as a liner and/or an etching stop layer in the back dielectric unit to separate the inter-metal dielectric from the back conductive unit, an electric leakage between two adjacent ones of metal lines and via contacts in the back conductive unit may be significantly reduced. In the case that the high thermal conductive materials also have a relatively low dielectric constant, the front dielectric unit, which is disposed on the front-side of the integrated circuit, may be re-designed to have a configuration similar to that of the back dielectric unit, such that RC time delays of the integrated circuit will not be adversely affected and such that the heat generated during operation can be more efficiently dissipated through both sides of the integrated circuit.

In accordance with some embodiments of the present disclosure, a semiconductor structure includes: a base structure including a substrate and a device unit disposed on a front surface of the substrate; a front dielectric portion disposed on the front surface to cover the device unit; a front conductive layer disposed in the front dielectric portion and connected to the device unit, the front conductive layer being electrically conductive; a back dielectric unit disposed on a back surface of the substrate opposite to the front surface and including at least one first part which includes a first dielectric portion having a thermal conductivity which is greater than that of the front dielectric portion; and a back conductive unit disposed in the back dielectric unit and connected to the device unit, the back conductive unit including at least one first conductive layer disposed in the at least one first part, the back conductive unit being electrically conductive.

In accordance with some embodiments of the present disclosure, the at least one first part further includes a first liner portion which has a breakdown field which is greater than that of the first dielectric portion, and which is disposed to separate the at least one first conductive layer from the first dielectric portion.

In accordance with some embodiments of the present disclosure, the at least one first part includes three of the first parts which are stacked on each other, and the at least one first conductive layer includes three of the first conductive layers which are respectively formed in the first parts. A first one and a second one of the first conductive layers, which are respectively proximate to and distal from the base structure, serve as a first via feature and a second via feature, respectively. A middle one of the first conductive layers, which is connected to the first via feature and the second via feature, serves as a line feature. Each of the first via feature, the second via feature and the line feature has a first surface which is proximate to the base structure, a second surface which is distal from the base structure, and a connecting surface which is connected to the first surface and the second surface and which is covered by the first liner portion of a corresponding one of the first parts. The first surface of the line feature has a first connecting region which is connected to the first via feature and a first routing region which extends away from the first connecting region, and which is further covered by the first line portion of the corresponding one of the first parts.

In accordance with some embodiments of the present disclosure, the back dielectric unit further includes three etching stop layers disposed to alternate with the first parts. Each of the etching stop layers has an etching selectivity ratio different from that of the first dielectric portion of each of the first parts and has a breakdown field which is greater than that of the first dielectric portion of each of the first parts. The second surface of the line feature has a second connecting region which is connected to the second via feature, and a second routing region which extends away from the second connecting region and which is covered by a corresponding one of the etching stop layers.

In accordance with some embodiments of the present disclosure, the back dielectric unit further includes at least one second part which includes a second dielectric portion and which is disposed to alternate with the at least one first part. The second dielectric portion has a breakdown field which is greater than that of the first dielectric portion. The back conductive unit further includes at least one second conductive layer which is disposed in the at least one second part and which is connected to the at least one first conductive layer.

In accordance with some embodiments of the present disclosure, one of the at least one first conductive layer and the at least one second conductive layer is configured as a line feature, and the other one of the at least one first conductive layer and the at least one second conductive layer is configured as a via feature.

In accordance with some embodiments of the present disclosure, the at least one second part further includes a second liner portion which is disposed to separate the at least one second conductive layer from the second dielectric portion. The second liner portion has a breakdown field which is greater than that of the first dielectric portion.

In accordance with some embodiments of the present disclosure, the first liner portion and the second liner portion extend toward and are connected to each other.

In accordance with some embodiments of the present disclosure, a semiconductor structure includes: a base structure including a substrate; a dielectric part disposed on the substrate and including a first region proximate to the substrate and a second region distal from the substrate, at least one of the first region and the second region having a thermal conductivity which is greater than 10 W/mK; and a conductive layer disposed in the dielectric part, and including a via portion that is disposed in the first region and a line portion that is coupled to the via portion and that is disposed in the second region.

In accordance with some embodiments of the present disclosure, the base structure further includes a device unit disposed on a front surface of the substrate. The dielectric part is disposed on a back surface of the substrate opposite to the front surface.

In accordance with some embodiments of the present disclosure, the dielectric part further includes a liner portion which is disposed to entirely separate the conductive layer from the first region and the second region, and which has a breakdown field which is greater than that of the at least one of the first region and the second region.

In accordance with some embodiments of the present disclosure, the first region has a thermal conductivity which is greater than 10 W/mK, the second region having a breakdown field which is greater than that of the first region.

In accordance with some embodiments of the present disclosure, the second region has a thermal conductivity which is greater than 10 W/mK, and the first region has a breakdown field which is greater than that of the second region.

In accordance with some embodiments of the present disclosure, each of the first region and the second region has a thermal conductivity which is greater than 10 W/mK.

In accordance with some embodiments of the present disclosure, at least one of the first region and the second region has a thermal conductivity which is greater than 100 W/mK.

In accordance with some embodiments of the present disclosure, the at least one of the first region and the second region is made of diamond, graphite, aluminum nitride, aluminum oxide, boron arsenide, boron carbide, beryllium oxide, silicon oxide, silicon nitride, silicon carbide, magnesium oxide, zirconium oxide, bismuth oxide, titanium oxide, gallium oxide, gallium nitride, gallium arsenide, hafnium oxide, indium antimony, graphene, hexagonal-boron nitride, beta-carbon nitride, or combinations thereof.

In accordance with some embodiments of the present disclosure, the dielectric part further includes a liner portion which is disposed to entirely separate the conductive layer from the first region and the second region, and which has a breakdown field which is greater than that of the at least one of the first region and the second region. The liner portion includes silicon oxide, silicon nitride, silicon carbide, silicon carbon nitride, aluminum oxide, aluminum nitride, aluminum oxynitride, zirconium oxide, hafnium oxide, zirconium aluminum oxide, hafnium aluminum oxide, hafnium silicon oxide, beryllium oxide, boron arsenide, boron carbide, magnesium oxide, bismuth oxide, titanium oxide, gallium oxide, gallium nitride, diamond, graphite, graphene, hexagonal-boron nitride, beta-carbon nitride, or combinations thereof.

In accordance with some embodiments of the present disclosure, the base structure further includes a power via which is disposed in the substrate and which is coupled between the device unit and the conductive layer.

In accordance with some embodiments of the present disclosure, a method for manufacturing a semiconductor structure, comprising: forming a base structure including a substrate; forming a dielectric part on the substrate, the dielectric part including a first region proximate to the substrate and a second region distal from the substrate, at least one of the first region and the second region having a thermal conductivity which is greater than 10 W/mK; and forming a conductive layer in the dielectric part, the conductive layer including a via portion which is disposed in the first region and a line portion that is coupled to the via portion and that is disposed in the second region.

In accordance with some embodiments of the present disclosure, the method further includes forming a liner portion to entirely separate the conductive layer from the first region and the second region. The liner portion has a breakdown field which is greater than that of at least one of the first region and the second region.

In accordance with some embodiments of the present disclosure, the semiconductor structure further includes an etching stop layer disposed between the dielectric part and the substrate so as to entirely separate the first region from the substrate, the etching stop layer having an etching selectivity ratio different from that of each of the first region and the second region and having a breakdown field which is greater than that of the at least one of the first region and the second region.

In accordance with some embodiments of the present disclosure, the semiconductor structure further includes a diffusion barrier portion which is disposed between the dielectric part and the conductive layer.

In accordance with some embodiments of the present disclosure, the semiconductor structure further includes the diffusion barrier portion includes tantalum, tantalum nitride, aluminum, aluminum oxide, titanium, titanium nitride, cobalt, niobium, lead, platinum, nickel, scandium, ruthenium, molybdenum, tungsten, iridium, rhodium, or combinations thereof.

In accordance with some embodiments of the present disclosure, a semiconductor structure includes: a base structure including a substrate; a dielectric unit disposed on the substrate and including at least one first part which includes a first dielectric portion having a thermal conductivity greater than 10 W/mK; and a conductive unit disposed in the dielectric unit and including at least one first conductive layer disposed in the at least one first part 13), the conductive unit being electrically conductive.

In accordance with some embodiments of the present disclosure, the base structure further includes a device unit disposed on a front surface of the substrate. The dielectric unit is disposed on a back surface of the substrate opposite to the front surface.

In accordance with some embodiments of the present disclosure, the at least one first part includes a plurality of the first parts, and the at least one first conductive layer includes a plurality of the first conductive layers which are formed respectively in the first parts. The dielectric unit further includes a plurality of etching stop layers disposed to alternate with the first parts. Each of the etching stop layers is patterned such that two adjacent ones of the first conductive layers are in contact with each other through a corresponding one of the etching stop layers, and such that two adjacent ones of the first parts are separated from each other by a corresponding one of the etching stop layers.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor structure, comprising:

forming a base structure including a substrate;

forming a dielectric part on the substrate, the dielectric part including a first region proximate to the substrate and a second region distal from the substrate, one of the first region and the second region having a thermal conductivity which is greater than 10 W/mK; and forming a conductive layer and a liner layer in the dielectric part, the conductive layer including a via portion which is disposed in the first region, and a line portion which is coupled to the via portion and which is disposed in the second region, the liner layer entirely separates the conductive layer from the first region and the second region wherein a breakdown field of the liner layer is greater than a breakdown field one of the first region and the second region.

2. The method as claimed in claim 1, wherein the dielectric part includes diamond, graphite, aluminum nitride, aluminum oxide, boron arsenide, boron carbide, beryllium oxide, silicon oxide, silicon nitride, silicon carbide, magnesium oxide, zirconium oxide, bismuth oxide, titanium oxide, gallium oxide, gallium nitride, gallium arsenide, hafnium oxide, indium antimony, graphene, hexagonal-boron nitride, beta-carbon nitride, or combinations thereof.

3. The method as claimed in claim 1, wherein the first region and the second region are made of different materials.

4. A method for manufacturing a semiconductor structure, comprising:

depositing a front dielectric layer over a front surface of a semiconductor substrate;

forming a front conductive feature in the front dielectric layer;

flipping the semiconductor substrate so as to permit a back surface of the semiconductor substrate to face upward, the back surface of the semiconductor substrate being opposite to the front surface of the semiconductor substrate;

depositing a back dielectric layer on the back surface of the semiconductor substrate, the back dielectric layer having a thermal conductivity that is greater than a thermal conductivity of the front dielectric layer;

patterning the back dielectric layer to form a recess in the back dielectric layer;

depositing a conductive layer in the recess; and planarizing the conductive layer to form a back conductive feature in the back dielectric layer.

5. The method as claimed in claim 4, further comprising:

before deposition of the front dielectric layer, forming a device on the front surface of the semiconductor substrate.

6. The method as claimed in claim 5, further comprising:

before deposition of the front dielectric layer, forming a power via which extends from the front surface of the semiconductor substrate into an interior of the semiconductor substrate, the power via being connected to the device.

7. The method as claimed in claim 6, further comprising:

after flipping the semiconductor substrate and before deposition of the back dielectric layer, performing a removal process on the back surface of the semiconductor substrate to expose the power via.

8. The method as claimed in claim 7, wherein the power via is exposed to the recess after patterning the back dielectric layer and before deposition of the conductive layer.

9. The method as claimed in claim 8, further comprising:

after patterning the back dielectric layer and before deposition of the conductive layer, depositing a liner layer on an inner sidewall of the recess so as to permit the power via to be exposed from the liner layer, the liner layer having a breakdown field that is greater than a breakdown field of the back dielectric layer.

10. The method as claimed in claim 9, wherein the liner layer includes silicon oxide, silicon nitride, silicon carbide, silicon carbon nitride, aluminum oxide, aluminum nitride, aluminum oxynitride, zirconium oxide, hafnium oxide, zirconium aluminum oxide, hafnium aluminum oxide, hafnium silicon oxide, beryllium oxide, boron arsenide, boron carbide, magnesium oxide, bismuth oxide, titanium oxide, gallium oxide, gallium nitride, diamond, graphite, graphene, hexagonal-boron nitride, beta-carbon nitride, or combinations thereof.

11. The method as claimed in claim 9, further comprising:
after deposition of the liner layer and before deposition of the conductive layer, depositing a diffusion barrier layer on the liner layer and the power via, the diffusion barrier layer including Ta, TaN, Al, AlOx, Ti, TiN, Co, Nb, Pb, Pt, Ni, Sc, Ru, Mo, W, Ir, Rh, or combinations thereof.

12. The method as claimed in claim 11, wherein the diffusion barrier layer has a thickness less than a thickness of the liner layer.

13. The method as claimed in claim 4, wherein the thermal conductivity of the back dielectric layer is greater than 10 W/mk.

14. The method as claimed in claim 4, wherein the thermal conductivity of the back dielectric layer is greater than 100 W/mk.

15. The method as claimed in claim 4, wherein the back dielectric layer is made of diamond, graphite, aluminum nitride, aluminum oxide, boron arsenide, boron carbide, beryllium oxide, silicon oxide, silicon nitride, silicon carbide, magnesium oxide, zirconium oxide, bismuth oxide, titanium oxide, gallium oxide, gallium nitride, gallium arsenide, hafnium oxide, indium antimony, graphene, hexagonal-boron nitride, beta-carbon nitride, or combinations thereof.

16. A method for manufacturing a semiconductor structure, comprising:
depositing an etch stop layer on a substrate;

depositing a stack of a first dielectric layer and a second dielectric layer on the etch stop layer, the etching stop layer having an etching rate that is less than an etching rate of the first dielectric layer and the second dielectric layer, one of the first dielectric layer and the second dielectric layer having a thermal conductivity that is greater than 10 W/mK;
patterning the stack of the first dielectric layer and the second dielectric layer to form a recess;
depositing a conductive layer a liner layer in the recess, wherein the conductive layer is separated from the stack of the first dielectric layer and the second dielectric layer by the liner layer, the liner layer having a breakdown field that is greater than a breakdown field of the first dielectric layer; and
planarizing the conductive layer to form a conductive feature in the stack of the first dielectric layer and the second dielectric layer.

17. The method as claimed in claim 16, wherein the first dielectric layer has a thermal conductivity that is greater than 10 W/mK, and the second dielectric layer has a breakdown field that is greater than a breakdown field of the first dielectric layer.

18. The method as claimed in claim 16, wherein
the first dielectric layer is formed between the etching stop layer and the second dielectric layer, and
the recess includes a trench which is formed in the second dielectric layer, and a via opening which is formed in the first dielectric layer and which is in spatial communication with the trench.

19. The method as claimed in claim 16, wherein the liner layer is made of a dielectric material in an amorphous phase.

20. The method as claimed in claim 16, wherein the liner layer is made of a two-dimensional material which has a basal plane that is arranged to be parallel to the inner sidewall of the recess.

* * * * *